(12) United States Patent
Cho et al.

(10) Patent No.: US 12,312,686 B2
(45) Date of Patent: May 27, 2025

(54) METHOD AND APPARATUS FOR FILLING GAP USING ATOMIC LAYER DEPOSITION

(71) Applicants: Samsung Electronics Co., Ltd., Suwon-si (KR); INCHEON NATIONAL UNIVERSITY RESEARCH & BUSINESS FOUNDATION, Incheon (KR)

(72) Inventors: Eunhyoung Cho, Suwon-si (KR); Hanboram Lee, Seoul (KR); Sunghee Lee, Suwon-si (KR); Jeongyub Lee, Yongin-si (KR); Chi Thang Nguyen, Incheon (KR)

(73) Assignees: Samsung Electronics Co., Ltd., Gyeonggi-do (KR); Incheon National University Research & Business Foundation, Incheon (KR)

( * ) Notice: Subject to any disclaimer, the term of this patent is extended or adjusted under 35 U.S.C. 154(b) by 583 days.

(21) Appl. No.: 17/336,773

(22) Filed: Jun. 2, 2021

(65) Prior Publication Data

US 2021/0395888 A1    Dec. 23, 2021

(30) Foreign Application Priority Data

Jun. 19, 2020  (KR) .................. 10-2020-0075031
Apr. 28, 2021  (KR) .................. 10-2021-0055001

(51) Int. Cl.
  *C23C 16/455* (2006.01)
  *C23C 16/40* (2006.01)
  *H01L 21/768* (2006.01)

(52) U.S. Cl.
  CPC ...... *C23C 16/45529* (2013.01); *C23C 16/402* (2013.01); *C23C 16/405* (2013.01);
  (Continued)

(58) Field of Classification Search
  None
  See application file for complete search history.

(56) References Cited

U.S. PATENT DOCUMENTS 9,812,320 B1   11/2017  Pore et al.
10,037,884 B2   7/2018  Ou et al.
(Continued)

FOREIGN PATENT DOCUMENTS

| KR | 2012/0031915 A | 4/2012 |
| KR | 2015-0099451 A | 8/2015 |
| KR | 2018-0061387 A | 6/2018 |
| WO | WO-2020/112487 A1 | 6/2020 |

OTHER PUBLICATIONS

Extended European Search Report dated Nov. 22, 2021, issued in corresponding European Patent Application No. 21176278.6.
(Continued)

*Primary Examiner* — Mandy C Louie
(74) *Attorney, Agent, or Firm* — HARNESS, DICKEY & PIERCE, P.L.C.

(57) ABSTRACT

A method and an apparatus for filling a gap by using an atomic layer deposition (ALD) method are provided. The method includes forming a first reaction inhibition layer by adsorbing a reaction inhibitor onto a side wall of the gap, forming a first precursor layer by adsorbing a first reactant onto the bottom of the gap and the side wall of the gap around the bottom of the gap, and forming a first atomic layer on the bottom of the gap and the side wall of the gap around the bottom of the gap. The reaction inhibitor includes a precursor material that does not react with a second reactant. The first reaction inhibition layer may have a density gradient in which a density of the reaction inhibitor decreases toward a bottom of the gap. The forming the first atomic layer includes adsorbing the second reactant onto the first precursor layer.

34 Claims, 34 Drawing Sheets

(52) U.S. Cl.
CPC .... *C23C 16/4554* (2013.01); *C23C 16/45544* (2013.01); *H01L 21/76837* (2013.01)

(56) References Cited

U.S. PATENT DOCUMENTS

| | | | |
|---|---|---|---|
| 10,741,458 | B2 | 8/2020 | Kang et al. |
| 2012/0077322 | A1 | 3/2012 | Hirota et al. |
| 2017/0114459 | A1* | 4/2017 | Saly ..................... C23C 16/345 |
| 2017/0175266 | A1* | 6/2017 | Kumagai ................ C23C 16/50 |
| 2019/0164762 | A1* | 5/2019 | Su ..................... H01L 21/76897 |
| 2020/0035613 | A1 | 1/2020 | Kim et al. |

OTHER PUBLICATIONS

Tushar K. Talukdar et al., "Seamless fill of deep trenches by chemical vapor deposition: Use of a molecular growth inhibitor to eliminate pinch-off" Journal of Vacuum Science and Technology A, vol. 37, No. 2, 2019, pp. 021509-1-021509-10.

Rizwan Khan et al., 'Area-selective Atomic Layer Deposition using Si Precursors as Inhibitors' *Chemistry of Materials*, Oct. 2018, pp. 7603-7610.

Aleksandra Zydor et al., 'First principles simulation of reaction steps in the atomic layer deposition of titania: dependence of growth on Lewis acidity of titanocene precursor' *Phys. Chem. Chem. Phys.*, vol. 14, 2012, pp. 7954-7964.

Roy G. Gordon et al., 'A Kinetic Model for Step Coverage by Atomic Layer Deposition in Narrow Holes or Trenches' *Chemical Vapor Deposition*, vol. 9, No. 2, 2003, pp. 73-78.

Aleksandra Zydor and Simon D. Elliott, 'TiCp*(OMe)$_3$ versus Ti(OMe)$_4$ in Atomic Layer Deposition of TiO$_2$ with Water-Ab Initio Modelling of Atomic Layer Deposition Surface Reactions' *Journal of Nanoscience and Nanotechnology*, vol. 11, 2011, pp. 8089-8093.

Chinese Office Action dated Jan. 20, 2025 for corresponding Chinese Patent Application No. 202110653245.4 and its English-languge translation.

* cited by examiner

METHOD AND APPARATUS FOR FILLING GAP USING ATOMIC LAYER DEPOSITION

CROSS-REFERENCE TO RELATED APPLICATION

This application claims the benefit of Korean Patent Application Nos. 10-2020-0075031, filed on Jun. 19, 2020, and 10-2021-0055001, filed on Apr. 28, 2021, in the Korean Intellectual Property Office, the disclosure of which is incorporated herein in its entirety by reference.

BACKGROUND

1. Field

The disclosure relates to a method and/or an apparatus for filling a gap using atomic layer-deposition (ALD).

2. Description of Related Art

As a process of filling a gap, such as a trench, etc., formed on a substrate, atomic layer deposition (ALD) has been used. For ALD, a surface reaction is used. Thus, when a gap is filled by using the ALD, a filling layer may be formed in a uniform thickness on surfaces around the gap so that a formation of voids may be reduced and/or minimized. However, when the gap has a high aspect ratio, a size of an entrance of the gap may become less than a size of an inner portion of the gap. Thus, even when the ALD is used, voids may be formed.

SUMMARY

One or more embodiments provide a method and/or an apparatus for filling a gap using an atomic layer deposition (ALD).

Additional aspects will be set forth in part in the description which follows and, in part, will be apparent from the description, or may be learned by practice of the presented embodiments of the disclosure.

According to an embodiment, there is provided a method of filling a gap formed on a substrate by using atomic layer deposition (ALD). The method includes forming a first reaction inhibition layer by adsorbing a reaction inhibitor onto a side wall of the gap, the reaction inhibitor including a precursor material that does not react with a second reactant, and the first reaction inhibition layer having a density gradient in which a density of the reaction inhibitor decreases toward a bottom of the gap; forming a first precursor layer by adsorbing a first reactant onto the bottom of the gap and the side wall of the gap around the bottom of the gap; and forming a first atomic layer on the bottom of the gap and the side wall of the gap around the bottom of the gap. The forming the first atomic layer includes adsorbing the second reactant onto the first precursor layer.

In some embodiments, the density gradient of the first reaction inhibition layer may be determined according to a following equation:

$$l = \frac{4w}{3}\left(\sqrt{1 + \frac{3}{8}\left(\frac{Pt}{S\sqrt{2\pi mkT}}\right)} - 1\right)$$

where $l$ indicates a depth (nm) of a location of the side wall of the gap, onto which the reaction inhibitor is adsorbed, w indicates a width (nm) of the gap, P indicates a partial pressure (Pa) of the reaction inhibitor in a reaction chamber, t indicates an exposure time (s) of the reaction inhibitor, m indicates a molecular mass (kg) of the reaction inhibitor, k indicates a Boltzmann factor $1.38 \times 10^{-23}$ J/K, and T indicates a temperature (K) in the reaction chamber. The variable S indicates a saturation dose (for example, $\sim 2.5 \times 10^{18}$ molecules*meter).

In some embodiments, the reaction inhibitor may be oxidized by $O_3$ or an $O_2$ plasma. The reaction inhibitor may be converted into a material of the first atomic layer via $O_3$ or $O_2$ plasma processing.

In some embodiments, the reaction inhibitor may not react with $H_2O$ or $O_2$.

In some embodiments, the reaction inhibitor may include a center metal and an organic ligand.

In some embodiments, the organic ligand may include a cyclopentadienyl (Cp) ligand or a pentamethyl cyclopentadienyl (Cp*) ligand.

In some embodiments, the reaction inhibitor may include $(Me_2N)_2SiMe_2$, $TiCp^*(OMe)_3$, $Ti(CpMe)(O^iPr)_3$, $Ti(CpMe)(NMe_2)_3$, $ZrCp(NMe_2)_3$, $ZrCp_2Cl_2$, $Zr(Cp_2CMe_2)Me_2$, $Zr(Cp_2CMe_2)Me(OMe)$, $HfCp(NMe_2)_3$, or $Hf(CpMe)(NMe_2)_3$.

In some embodiments, the reaction inhibitor may have the same center metal as a metal of the first reactant.

In some embodiments, the first reactant may include $TiCl_4$, $Ti(O^iPr)_4$, $Ti(NMe_2)_4$, $Ti(NMeEt)_4$, $Ti(NEt_2)_4$, $ZrCl_4$, $Zr(NMe_2)_4$, $Zr(O^iBu)_4$, $ZrCp_2Me_2$, $Zr(MeCp)_2(OMe)Me$, $HfCl_4$, $Hf(NMe_2)_4$, $Hf(NEtMe)_4$, $Hf(NEt_2)_4$, $HfCp_2Me_2$, or $Hf(MeCp)_2(OMe)Me$.

In some embodiments, the second reactant may include $H_2O$ or $O_2$.

In some embodiments, an average density of the reaction inhibitor may increase as a partial pressure of the reaction inhibitor in a reaction chamber increases.

In some embodiments, the adsorbing the reaction inhibitor may be repeatedly performed for a plurality of cycles, and an average density of the reaction inhibitor may increase as a number of cycles increases.

In some embodiments, the method may further include forming a first filling layer by repeatedly performing the forming the first precursor layer and the forming the first atomic layer for a plurality of cycles.

In some embodiments, the density of the reaction inhibitor may decrease toward the bottom of the gap so that the first filling layer may be formed in a bottom-up direction from the bottom of the gap.

In some embodiments, the first filling layer may be formed to have a shape varying according to an average density of the reaction inhibitor.

In some embodiments, the first filling layer may have the shape in which the first filling layer is formed from in a bottom-up direction from the bottom of the gap.

In some embodiments, the first filling layer may have the shape in which the first filling layer is formed from the bottom of the gap and the side wall of the gap around the bottom of the gap.

In some embodiments, a gap filling process time may be adjusted according to the shape in which the first filling layer is formed.

In some embodiments, the method may further include forming a second reaction inhibition layer on the side wall of the gap after forming the first filling layer; forming a second precursor layer on an upper surface of the first filling layer and the side wall of the gap around the upper surface of the first filling layer; and forming a second atomic layer on the upper surface of the first filling layer and the side wall of the gap around the upper surface of the first filling layer.

In some embodiments, the method may further include forming a second filling layer in a bottom-up direction from the upper surface of the first filling layer, by repeatedly performing the forming the second precursor layer and the forming the second atomic layer for a plurality of cycles.

According to an embodiment, a device may include a structure defining a gap having a high aspect ratio; and a filling layer in the gap, where the filling layer may be formed by the method described above.

In some embodiments, the gap may have a nano-sized width and an aspect ratio that is equal to or greater than about 10.

The device may include a meta-lens including the structure defining the gap. The structure defining the gap may be a nanostructure in which the gap is formed. The filling layer may fill gap and have a higher refractive index than the nanostructure.

In some embodiments, the nanostructure may include $SiO_2$, and the filling layer may include $TiO_2$.

In some embodiments, the structure defining the gap may be an interconnect structure including an insulating layer in which the gap is formed and the filling layer may fill the gap. The filling layer may include a conductive material.

In some embodiments, the structure defining the gap may device may include a three-dimensional (3D) NAND flash memory device including memory cells through which the gap penetrates; and the filling layer filling the gap. The filling layer may include an insulating material.

According to an embodiment, there is provided a method of filling a gap formed on a substrate by using atomic layer deposition (ALD). The method includes forming a first filling layer by sequentially adsorbing a first reactant and a second reactant onto a side wall and a bottom of the gap; forming a first reaction inhibition layer by adsorbing a reaction inhibitor onto the first filling layer formed on the side wall of the gap, the reaction inhibitor including a precursor material that does not react with the second reactant, the first reaction inhibition layer having a density gradient in which a density of the reaction inhibitor decreases toward the bottom of the gap; forming a first precursor layer, the forming the first precursor layer including adsorbing the first reactant onto the first filling layer formed on the bottom of the gap and around the bottom of the gap; and forming a first atomic layer on the first filling layer formed on the bottom of the gap and around the bottom of the gap, the forming the first atomic layer including adsorbing the second reactant onto the first precursor layer.

In some embodiments, the method may further include forming a second filling layer in a bottom-up direction from an upper surface of the first atomic layer, wherein the forming the second filling layer may include repeatedly performing the forming the first precursor layer and the forming the first atomic layer for a plurality of cycles.

The method, after forming the second filling layer, may further include forming a second reaction inhibition layer on the first filling layer formed on the side wall of the gap; forming a second precursor layer on an upper surface of the second filling layer and the first filling layer around the upper surface of the second filling layer; forming a second atomic layer on the upper surface of the second filling layer and the first filling layer around the upper surface of the second filling layer; and forming a third filling layer in the bottom-up direction from the upper surface of the second filling layer. The forming the third filling layer may include repeatedly performing the forming the second precursor layer and the forming the second atomic layer for a plurality of cycles.

According to an embodiment, a device may include a structure defining a gap having a high aspect ratio; and a filling layer in the gap. The filling layer may be formed in the gap using the method described above.

According to an embodiment, an atomic layer deposition (ALD) apparatus includes a substrate including a plurality of processing areas; and a reactant supply device on the substrate, the reactant supply device being configured to fill a gap formed on each of the plurality of processing areas. The reactant supply device may include at least one first supply unit, at least one second supply unit, and at least one third supply unit. The at least one first supply unit may be configured to form a reaction inhibition layer on a side wall of the gap by supplying a reaction inhibitor to the substrate. The at least one second supply unit may be configured to form a precursor layer on a bottom of the gap and the side wall of the gap around the bottom of the gap by supplying a first reactant to the substrate. The at least one third supply unit may be configured to form an atomic layer on the bottom of the gap and the side wall of the gap around the bottom of the gap by supplying a second reactant to the substrate. The reaction inhibitor may include a precursor material that does not react with the second reactant.

In some embodiments, the ALD apparatus may further include purging units between adjacent supply units among the at least one first supply unit, the at least one second supply unit, and the at least one third supply unit.

In some embodiments, the reaction inhibition layer may have a density gradient in which a density of the reaction inhibitor decreases toward the bottom of the gap.

In some embodiments, the density gradient of the reaction inhibition layer may be determined according to a rotational speed of the substrate and a number of rotations of the substrate.

According to an embodiment, a method of filling a gap formed on a structure using atomic layer deposition (ALD) is provided. The structure defines the gap and includes a first reaction inhibitor layer including a reaction inhibitor adsorbed onto a side wall of the gap. The method includes forming a first precursor layer by adsorbing a first reactant onto a first exposed region of the gap and forming a first atomic layer on the first exposed region of the gap by adsorbing a second reactant onto the first precursor layer. The first exposed region of the gap includes a bottom of the gap and first portions of the side wall of the gap around the bottom of the gap. The first reaction inhibition layer defines the first exposed region of the gap based on the first reaction inhibition layer having a density gradient in which a density of the reaction inhibitor decreases toward the bottom of the gap such that the first reaction inhibition layer exposes the first portions of the side wall of the gap and the bottom of the gap. The reaction inhibitor includes a precursor material. The second reactant is a material that does not react with the precursor material in the reaction inhibitor.

In some embodiments, the reaction inhibitor may be oxidized by $O_3$ or an $O_2$ plasma.

In some embodiments, the method may further include removing the reaction inhibitor by converting the reaction inhibitor into a material of the first atomic layer via $O_3$ or $O_2$ plasma processing.

In some embodiments, the reaction inhibitor may include a center metal and an organic ligand.

In some embodiments, the second reactant may include $H_2O$ or $O_2$.

According to an embodiment, a device may include a filling layer formed using the method above. The filling layer may be provided in the gap. The gap may have a high aspect ratio. The gap may have a nano-sized width and an aspect ratio that is equal to or greater than about 10.

In some embodiments, the device may include a meta-lens including the structure in which the gap is formed. A refractive index of the filling layer may be higher than a refractive index of a region of the structure surrounding the gap.

In some embodiments, in the device, the structure in which the gap is formed may be an insulating layer and the filling layer in the gap may include a conductive material.

In some embodiments, in the device, the structure in which the gap is formed may include memory cells.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
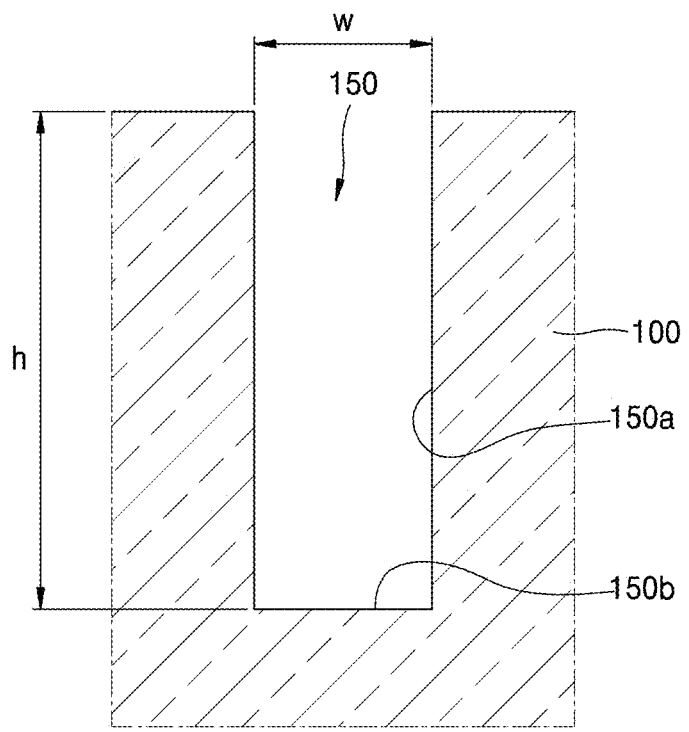
FIGS. 1 through 10C are views for describing a method of filling a gap according to example embodiments.

Reference will now be made in detail to embodiments, examples of which are illustrated in the accompanying drawings, wherein like reference numerals refer to like elements throughout. In this regard, the presented embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments will be described in detail with reference to the accompanying drawings. In the drawings, the same reference numerals denote the same elements and the sizes of elements may be exaggerated for clarity and convenience of explanation. The embodiments described hereinafter are only non-limiting examples, and various modifications may be made based on the embodiments.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent.

Unless orders of operations included in a method are specifically described or there are contrary descriptions, the operations may be performed according to appropriate orders.

The use of all examples and example terms are merely for describing the disclosure in detail and the disclosure is not limited to the examples and the example terms, unless they are not defined in the scope of the claims.

Recently, a high efficiency flat meta lens of a nanostructure having a high precision and a high aspect ratio has been developed. The high efficiency flat meta lens may be broadly employed in various fields, such as a laser-based microscope, imaging techniques, spectroscopy techniques, etc. A method of filling a gap, which is to be described hereinafter, may be applied as a manufacturing technique of a metasurface device requiring a nanostructure having a high precision and a high aspect ratio.

As a semiconductor device has become highly integrated, planar sizes of discrete devices or interconnects have become gradually decreased. On the contrary, thicknesses of layers included in the semiconductor device have become gradually increased. Also, along with the development of a multi-layer technique of three-dimensionally arranging or connecting the discrete devices of the semiconductor device has been developed, a large step height may occur and a deep gap having a high aspect ratio may be formed, on a surface of a process substrate, according to each processing operation. When an interlayer insulating layer is formed on the process substrate having the large step height and the deep gap having the high aspect ratio, voids, etc. may be easily formed. The method of filling the gap to be described hereinafter may be applied in manufacturing of a semiconductor device, as a technique for filling a deep gap having a high aspect ratio, which is formed in a process substrate.

Also, the method of filling the gap described below may be used in various fields, for which forming a thin layer is important, such as optical sensors including a photoelectron device, an oxygen sensor, an optical measurer, etc., catalysts including a hydrogen photocatalyst, a catalyst in the artificial biotechnology, biomedical materials and devices, and the like.

FIGS. 1 through 10C are views for describing a method of filling a gap 150, according to an example embodiment.

In the method of filling the gap 150, according to the example embodiment, first, first through third reaction inhibition layers 111, 112, and 113 may be formed by having a reaction inhibitor be adsorbed onto a side wall 150a of the gap 150. Next, a first atomic layer 131 may be formed by having a first reactant, which is a precursor material, and a second reactant, which is a co-reactant of the first reactant, adsorbed onto a bottom 150b of the gap 150 and around the bottom 150b of the gap 150 through an atomic layer deposition (ALD) process. Thereafter, the first and second reactants may be repeatedly adsorbed for a plurality of cycles to form first through third filling layers 141, 142, and 143 in a bottom-up direction from the bottom 150b of the gap 150. Hereinafter, the method of filling the gap, according to an example embodiment, will be described in detail.

Referring to FIG. 1, a structure, such as a substrate 100, including the gap 150 may be disposed in a reaction chamber (not shown) of an ALD apparatus. Here, the gap 150 in the substrate 100 may have a certain width w and a certain depth h.

The gap 150 may have, for example, a high aspect ratio of about 10 or more (e.g., 10 to 20, 10 to 50, but not limited thereto), but is not limited thereto. Here, the aspect ratio denotes a ratio h/w of a depth h to a width w of the gap 150. The gap 150 may have, for example, a width w of about dozens of nm. As a detailed example, the gap 150 may have a width w of about 20 nm to about 100 nm. However, it is only an example, and the width w of the gap 150 may be variously modified.

Figure 2:
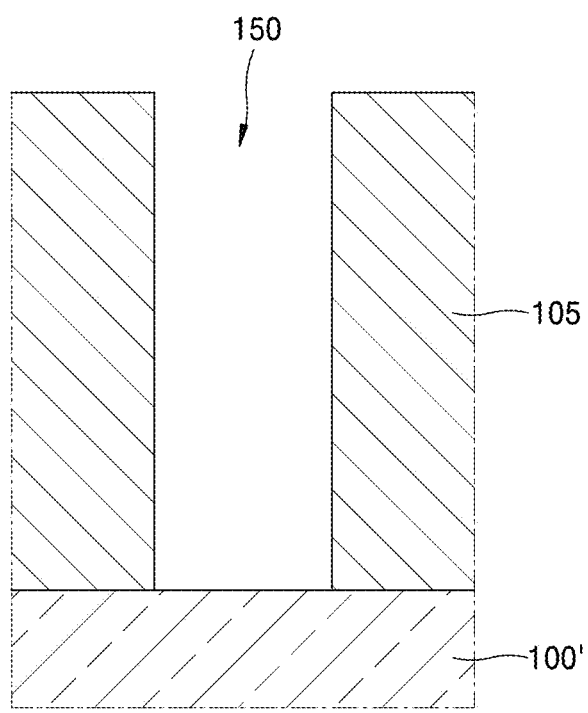

As illustrated in FIG. 2, a structure in which a material layer 105 having the gap 150 is formed on a substrate 100' may be provided in a reaction chamber. For example, the substrate 100' may include silicon, and the material layer 105 may include silicon oxide. In this case, an etch stop layer (not shown) including $HfO_2$ may further be provided between the substrate 100' and the material layer 105.

Figure 3:
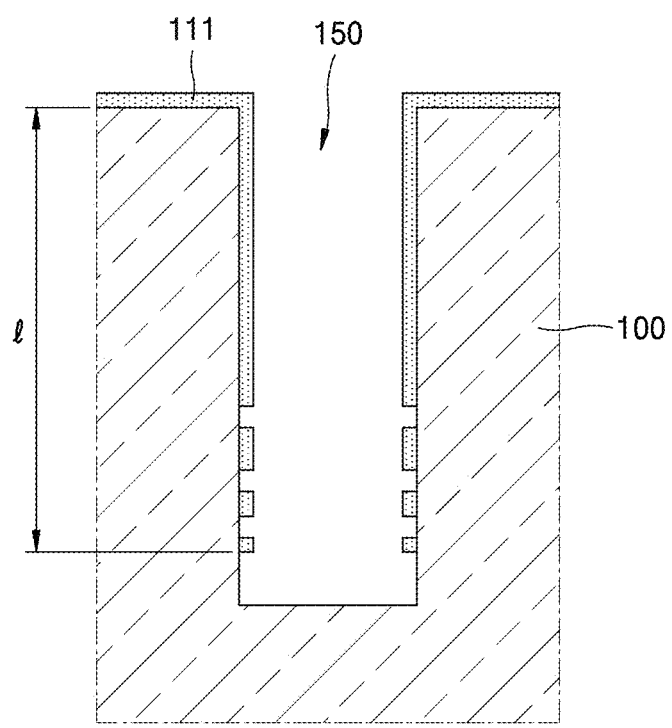

Referring to FIG. 3, a first reaction inhibition layer 111 may be formed on the side wall 150a of the gap 150. The first reaction inhibition layer 111 may be formed by adsorbing a reaction inhibitor onto the side wall 150a of the gap 150. Here, the reaction inhibitor may include a precursor material that does not react with the second reactant, which is used as the co-reactant in the ALD process that is performed after forming the first reaction inhibition layer 111.

The first reaction inhibition layer 111 may have a density gradient in which a density of the reaction inhibitor decreases from an entrance of the gap 150 toward the bottom 150b of the gap 150. Thus, the bottom 150b of the gap 150 and around the bottom 150b of the gap 150 may not be covered by the first reaction inhibition layer 111 and may be exposed.

Hereinafter, materials of the reaction inhibitor will be described.

According to the present embodiment, the reaction inhibitor may have the basic characteristics that are similar as those of a previous ALD precursor having a process compatibility with the ALD process. In detail, the reaction inhibitor may have to have excellent reactivity so as to have a short exposure time, good volatility so as to be easily vaporized, and good thermal adsorbability with respect to a substrate. Also, the reaction inhibitor may have to be thermally stable, have to generate volatile by-products having no reactivity, and have to be highly pure, economically feasible, easy to handle, and environmentally friendly in order to be suitable for mass production. Thus, the reaction inhibitor may be selected from among previously known ALD precursors, but is not limited thereto.

Also, the reaction inhibitor may further include the following two characteristics.

First, the reaction inhibitor may be changed into a thin layer only by being oxidized by a strong co-reactant, such as an $O_2$ plasma or $O_3$. Second, the reaction inhibitor may not react with $H_2O$ or $O_2$ (e.g., $H_2O$ vapor or $O_2$ vapor) used as the co-reactant in the ALD process that is performed after the first reaction inhibition layer 111 is formed. As described below, additional characteristics of the reaction inhibitor may be identified by measuring a contact angle or a thickness change after performing the sequential ALD process.

Hereinafter, $Ti(OMe)_4$ and $TiCp^*(OMe)_3$ used as an ALD precursor for forming a $TiO_2$ thin layer will be compared. Here, Me corresponds to $CH_3$ and $Cp^*$ corresponds to pentamethyl cyclopentadienyl.

When a $Ti(OMe)_4$ precursor is used, a $TiO_2$ thin layer may be grown at a growth per cycle (GPC) of about 0.4 to 0.6 Å/cycle, in an ALD process using $H_2O$ as a co-reactant at a temperature of about 300° C. or less. However, when a $TiCp^*(OMe)_3$ precursor is used, a $TiO_2$ thin layer may not be formed in the ALD process using $H_2O$ as the co-reactant. The $TiO_2$ thin layer may be formed only by using an $O_2$ plasma or $O_3$ as the co-reactant.

The $TiCp^*(OMe)_3$ precursor may be strongly adsorbed onto $TiO_2$ through H-bonding. However, it is difficult to form a new Ti—O bond due to a steric hindrance of a $Cp^*$ ligand located thereon. Also, due to its hydrophobicity, the $Cp^*$ ligand may be difficult to oxidize by reacting with $H_2O$ in the ALD process after the first reaction inhibition layer 111 is formed. However, the $Cp^*$ ligand may be oxidized by an $O_2$ plasma or $O_3$, which is a stronger co-reactant than $H_2O$, so as to form a thin layer. Also, the $TiCp^*(OMe)_3$ precursor may not be adsorbed onto a pure $TiO_2$ surface.

Accordingly, it is identified that the $TiCp^*(OMe)_3$ precursor may have the characteristics of a reaction inhibitor in a process of forming a $TiO_2$ thin layer using an ALD process. In detail, when the $TiCp^*(OMe)_3$ precursor is used as a reaction inhibitor and an ALD process is performed by using an ALD precursor for forming a $TiO_2$ thin layer, for example, tetrakis(dimethylamido)titanium (TDMAT), which may be oxidized by $H_2O$, the reaction inhibitor and $H_2O$ may not react with each other in an area coated with the reaction inhibitor, and thus, a $TiO_2$ thin layer may not be formed, and TDMAT and $H_2O$ may react with each other in an area not coated with the reaction inhibitor, and thus, a $TiO_2$ thin layer may be formed. Also, because the $TiCp^*(OMe)_3$ precursor is not adsorbed onto a surface of $TiO_2$, even when the reaction inhibitor is repeatedly coated, the $TiCp^*(OMe)_3$ precursor may not be invaginated into the $TiO_2$ thin layer as impurities.

As described above, the reaction inhibitor may include a precursor material that does not react with $H_2O$ or $O_2$, where $H_2O$ or $O_2$ may be used as the co-reactant in the ALD process that is performed after forming the first reaction inhibition layer 111, from among ALD precursors.

The reaction inhibitor may include a precursor material including a center metal and an organic ligand. In this case, when the reaction inhibitor includes a precursor material having the same center metal as an ALD precursor of a material to be filled, invagination of impurities due to the reaction inhibitor may be reduced and/or minimized. For example, as described above, when the TiCp*(OMe)$_3$ precursor is used as the reaction inhibitor and TDMAT is used as the ALD precursor for forming a TiO$_2$ thin layer, invagination of impurities due to the reaction inhibitor may be reduced and/or minimized.

Table 1 below shows examples of a material that may be used as the reaction inhibitor when forming a thin layer (e.g., gap-filling material) of TiO$_2$, ZrO$_2$, and/or HfO$_2$.

TABLE 1

| Gap-filling Material | Inhibitor Precursor (reaction inhibitor) | ALD Precursor | Oxygen source |
|---|---|---|---|
| TiO$_2$ | TiCp*(OMe)$_3$, Ti(CpMe)(O$^i$Pr)$_3$ Ti(CpMe)(NMe$_2$)$_3$ | TiCl$_4$, Ti(O$^i$Pr)$_4$, Ti(NMe$_2$)$_4$, Ti(NMeEt)$_4$, Ti(NEt$_2$)$_4$ | H$_2$O |
| ZrO$_2$ | ZrCp(NMe$_2$)$_3$, ZrCp$_2$Cl$_2$ (MeCp)Zr(NMe$_2$)$_3$, Zr(CpEt)(NMe$_2$)$_3$, Zr(Cp$_2$CMe$_2$)Me$_2$, Zr(Cp$_2$CMe$_2$)Me(OMe) | ZrCl$_4$, Zr(NMe$_2$)$_4$, Zr(O$^t$Bu)$_4$, ZrCp$_2$Me$_2$, Zr(MeCp)$_2$(OMe)Me | H$_2$O |
| HfO$_2$ | Hf($^t$BuO)$_4$, Hf(O$^i$Pr)$_4$, HfCp(NMe$_2$)$_3$, Hf(CpMe)(NMe$_2$)$_3$, Hf(O$^i$Bu)(NEtMe)$_3$ | HfCl$_4$, Hf(NMe$_2$)$_4$, Hf(NEtMe)$_4$, Hf(NEt$_2$)$_4$, HfCp2Me$_2$, Hf(MeCp)$_2$(OMe)Me | H$_2$O |

Referring to Table 1, it is identified that the reaction inhibitor may have the same center metal as an ALD precursor of a thin layer which is to be formed. The reaction inhibitor described in Table 1 may have low reactivity with $H_2O$, and thus, may not be oxidized.

When the reaction inhibitor is coated at the level of an atomic layer and the amount of invaginated impurities has no great effects on the performance of a device, the reaction inhibitor may not necessarily have to have the same center metal as the ALD precursor of the thin layer to be formed. In this case, as the reaction inhibitor, various precursor materials not reacting with the co-reactant such as $H_2O$ or $O_2$ may be used, as described with respect to Table 2. The materials illustrated in Table 2 are only examples and other precursor materials may also be used.

TABLE 2

| Gap-filling Material | Inhibitor Precursor (reactor inhibitor) | ALD Precursor | Oxygen source |
|---|---|---|---|
| Oxides Nitrides Metals | (Me$_2$N)$_2$SiMe$_2$ TiCp*(OMe)$_3$, Ti(CpMe)(O$^i$Pr)$_3$ Ti(CpMe)(NMe$_2$)$_3$ ZrCp(NMe$_2$)$_3$, ZrCp$_2$Cl$_2$ Zr(Cp$_2$CMe$_2$)Me$_2$ Zr(Cp$_2$CMe$_2$)Me(OMe) HfCp(NMe$_2$)$_3$ Hf(CpMe)(NMe$_2$)$_3$ | TiCl$_4$, Ti(O$^i$Pr)$_4$, Ti(NMe$_2$)$_4$, Ti(NMeEt)$_4$, Ti(NEt$_2$)$_4$, ZrCl$_4$, Zr(NMe$_2$)$_4$, Zr(O$^t$Bu)$_4$, ZrCp$_2$Me$_2$, Zr(MeCp)$_2$(OMe)Me, HfCl$_4$, Hf(NMe$_2$)$_4$, Hf(NEtMe)$_4$, Hf(NEt$_2$)$_4$, HfCp$_2$Me$_2$, Hf(MeCp)$_2$(OMe)Me | H$_2$O Or O$_2$ |

The Cp-based precursors used as the reaction inhibitor, described in Table 2, may have no reactivity with $H_2O$ or $O_2$ due to a steric hindrance and hydrophobicity, and a thin layer may be formed by separating a ligand only by a strong co-reactant, such as an $O_2$ plasma or $O_3$. Also, even when the reaction inhibitor includes only one atomic layer, it may be difficult for the reaction inhibitor to adsorb onto other precursors, due to a steric hindrance, and thus, the reaction inhibitor may have the blocking characteristics.

When the material of the reaction inhibitor is selected, the next thing to be considered is an operation of controlling a density of the reaction inhibitor adsorbed onto a side wall of the gap. In an ALD process for a bottom-up gap filling method, the first reaction inhibition layer 111 may have to be coated on a wall surface of the gap 150 to have a density gradient in which a density of the reaction inhibitor decreases toward the bottom 150b of the gap 150. In detail, the density of the reaction inhibitor may have to be increased around an entrance of the gap 150 and gradually decreased along the side wall 150a of the gap 150 toward the bottom 150b of the gap 150, such that the reaction inhibitor may not be coated (and/or may be less coated) on the bottom 150b of the gap 150. The density gradient of the first reaction inhibition layer 111 may be obtained by adjusting the amount of exposure of the reaction inhibitor.

In detail, the density gradient of the first reaction inhibition layer 111 may be determined according to Equation 1 reflecting stoichiometry and a diffusion behavior of molecules.

$$l = \frac{4w}{3}\left(\sqrt{1 + \frac{3}{8}\left(\frac{Pt}{S\sqrt{2\pi mkT}}\right)} - 1\right) \quad \text{(Equation 1)}$$

Here, $l$ indicates a depth nm to a location of the side wall 150a of the gap 150, onto which the reaction inhibitor is adsorbed, w indicates a width nm of the gap 150, P indicates a partial pressure Pa of the reaction inhibitor in a reaction chamber, t indicates an exposure time s of the reaction inhibitor, m indicates a molecular mass kg of the reaction inhibitor, k indicates a Boltzmann constant, $1.38 \times 10^{-23}$ J/K, and T indicates a temperature K in the reaction chamber. The variable S indicates a saturation dose (for example, ~$2.5 \times 10^{18}$ molecules*meter).

In (Equation 1), $l$, the depth to the location of the side wall 150a of the gap 150, onto which the reaction inhibitor is adsorbed, may be determined by adjusting the amount of exposure (that is, multiplication of the partial pressure by the exposure time of the reaction inhibitor) of the reaction inhibitor. In this case, the density of the reaction inhibitor may be increased around the entrance of the gap 150 and may be gradually decreased along the side wall 150a of the gap 150 toward the bottom 150b of the gap 150.

An average density of the reaction inhibitor may be adjusted. Here, the average density of the reaction inhibitor denotes a compactness of the reaction inhibitor adsorbed onto the side wall 150a of the gap 150. When the average density of the reaction inhibitor is high, the reaction inhibitor may be more densely formed on the side wall 150a of the gap 150, compared to when the average density of the reaction inhibitor is low.

The average density of the reaction inhibitor may be adjusted, for example, by using the partial pressure Pa of the reaction inhibitor in the reaction chamber. In detail, as the partial pressure Pa of the reaction inhibitor increases, the average density of the reaction inhibitor may increase. Also, the adsorption of the reaction inhibitor may be repeatedly performed for a plurality of cycles, and in this case, as the number of cycles increases, the average density of the reaction inhibitor adsorbed onto the side wall 150*a* of the gap 150 may increase.

As described below, according to the average density of the reaction inhibitor, first filling layers (141 of FIG. 6 and 141' of FIG. 12) in the gap 150 may be formed to have varying shapes. FIG. 3 illustrates a case in which the average density of the reaction inhibitor is relatively higher than the average density of the reaction inhibitor of FIG. 11. Referring to FIG. 3, there may be a relatively large amount of reaction inhibitors on the side wall 150*a* of the gap 150 around the bottom 150*b* of the gap 150.

After the first reaction inhibition layer 111 is formed on the side wall 150*a* of the gap 150, a purging process for discharging materials remaining in the reaction chamber to the outside may be performed. The purging process may be performed by using, for example, a $N_2$ gas, but it is not limited thereto.

Figure 4:
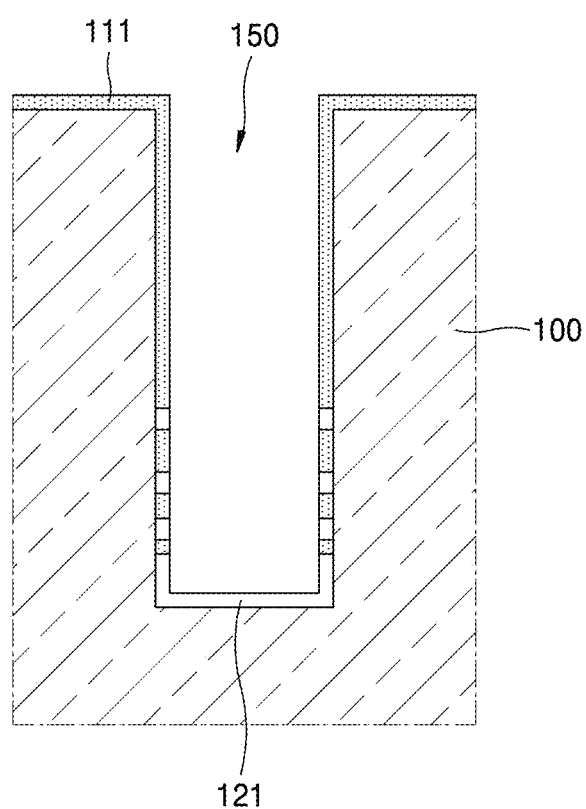

Referring to FIG. 4, a first precursor layer 121 may be formed on and around the bottom 150*b* of the gap 150. The first precursor layer 121 may be formed by having the first reactant adsorbed onto and around the bottom 150*b* of the gap 150. As described above, the first reaction inhibition layer 111 may be formed to have a density gradient in which the density of the reaction inhibitor decreases toward the bottom 150*b* of the gap 150. Thus, the bottom 150*b* of the gap 150 and the side wall 150*a* therearound may not be coated with the first reaction inhibition layer 111 and may be exposed. The first reactant may be adsorbed onto the exposed bottom 150*b* of the gap 150 and the exposed side wall 150*a* around the bottom 150*b*, to form the first precursor layer 121.

The first reactant may include a precursor material of a thin layer to be formed. For example, the first reactant may include $TiCl_4$, $Ti(O^iPr)_4$, $Ti(NMe_2)_4$, $Ti(NMeEt)_4$, $Ti(NEt_2)_4$, $ZrCl_4$, $Zr(NMe_2)_4$, $Zr(O^tBu)_4$, $ZrCp_2Me_2$, $Zr(MeCp)_2(OMe)Me$, $HfCl_4$, $Hf(NMe_2)_4$, $Hf(NEtMe)_4$, $Hf(NEt_2)_4$, $HfCp_2Me_2$, or $Hf(MeCp)_2(OMe)Me$. However, materials of the first reactant are not limited thereto. After forming the first precursor layer 121, a purging process may be performed.

Figure 5:
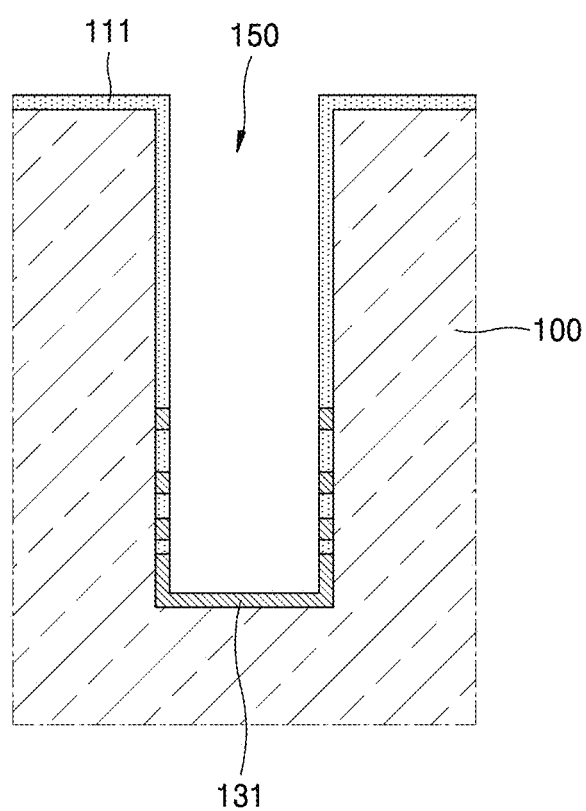

Referring to FIG. 5, the first atomic layer 131 may be formed on and around the bottom 150*b* of the gap 150. The first atomic layer 131 may be formed by having the second reactant be adsorbed onto the first precursor layer 121. The second reactant may be a co-reactant and may include, for example, $H_2O$ or $O_2$. The first atomic layer 131 may include oxide, nitride, or metals, but is not limited thereto.

As described above, the reaction inhibitor may include a precursor material not reacting with the second reactant. Thus, the second reactant introduced into the gap 150 may not react with the first reaction inhibition layer 111 and may react with the first reactant of the first precursor layer 121 to form the first atomic layer 131. As described above, the first atomic layer 131 may be formed only in an area of a wall surface of the gap 150, the area not being coated with the first reaction inhibition layer 111, that is, on the bottom 150*b* of the gap 150 and the side wall 150*a* around the bottom 150*b*. After the first atomic layer 131 is formed, a purging process may be performed.

Figure 6:
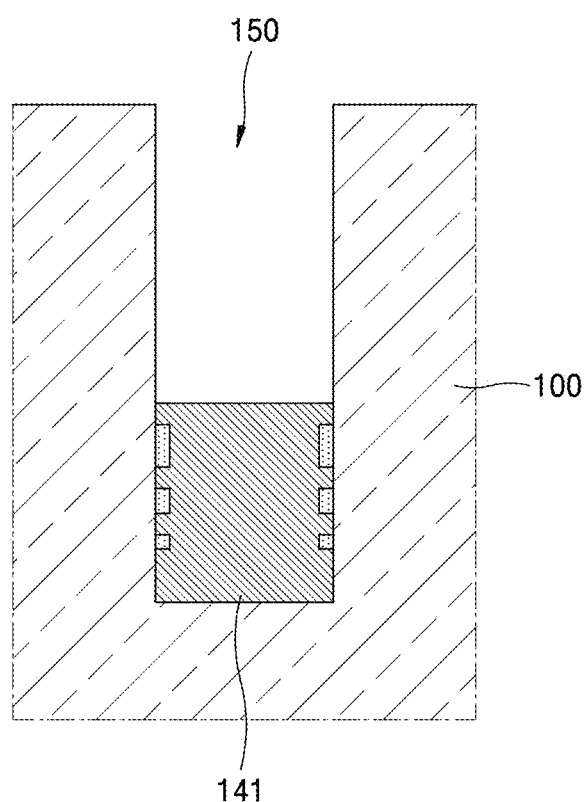

Referring to FIG. 6, the first filling layer 141 may be formed in a lower portion of the gap 150 to have a certain height, by repeatedly performing the adsorption of the first reactant and the adsorption of the second reactant for about dozens to hundreds of cycles (for example, about 30 to 600 cycles). Here, a cycle may include adsorption of the first reactant, purging, adsorption of the second reactant, and purging. When the average density of the reaction inhibitor adsorbed onto the side wall 150*a* of the gap 150 is relatively high as illustrated in FIG. 3, the first filling layer 141 may be formed in a bottom-up direction from the bottom 150*b* of the gap 150. The reaction inhibitor may remain on the side wall 150*a* of the gap 150, the side wall 150*a* contacting the first filling layer 141.

The amount of the first reaction inhibition layer 111 on the side wall 150*a* of the gap 150 may be gradually decreased by repeatedly performing the adsorption of the first reactant and the second reactant, and thus, the blocking characteristics of the first reaction inhibition layer 111 may be decreased.

Figure 7:
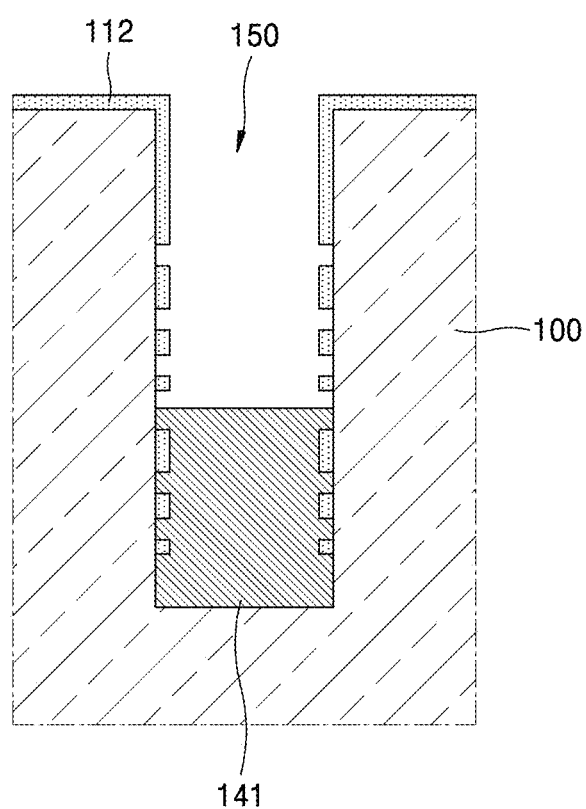

Referring to FIG. 7, the second reaction inhibition layer 112 may be formed on the side wall 150*a* of the gap 150. The second reaction inhibition layer 112 may be formed by having the reaction inhibitor adsorbed onto the side wall 150*a* of the gap 150. Here, the second reaction inhibition layer 112 may have a density gradient in which a density of the reaction inhibitor decreases from an entrance of the gap 150 toward the first filling layer 141. Thus, an upper surface of the first filling layer 141 and the side wall 150*a* of the gap 150 around the first filling layer 141 may not be covered by the second reaction inhibition layer 112 and may be exposed.

The reaction inhibitor may include a precursor material not reacting with the second reactant, such as $H_2O$ or $O_2$. The materials and the density adjusting of the reaction inhibitor are described above, and thus, their descriptions will be omitted. After the second reaction inhibition layer 112 is formed, a purging process may be performed.

Figure 8A:
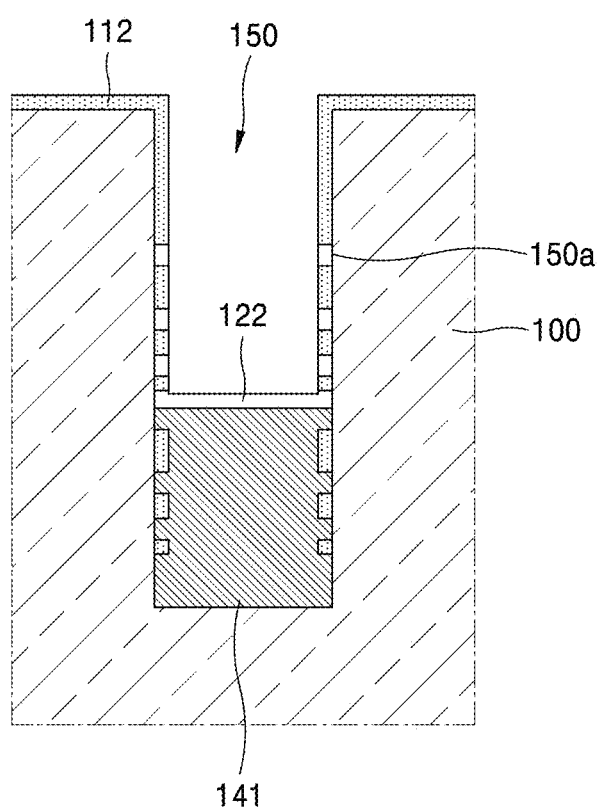

Referring to FIG. 8A, a second precursor layer 122 may be formed on the upper surface of the first filling layer 141 and the side wall 150*a* of the gap 150 around the first filling layer 141. The second precursor layer may be formed by having the first reactant adsorbed onto the upper surface of the first filling layer 141 and the side wall 150*a* of the gap 150 around the first filling layer 141, which are exposed through the second reaction inhibition layer 112. Here, the first reactant may include a precursor material of a thin layer to be formed, as described above. After the second precursor layer is formed, a purging process may be performed.

Figure 8B:
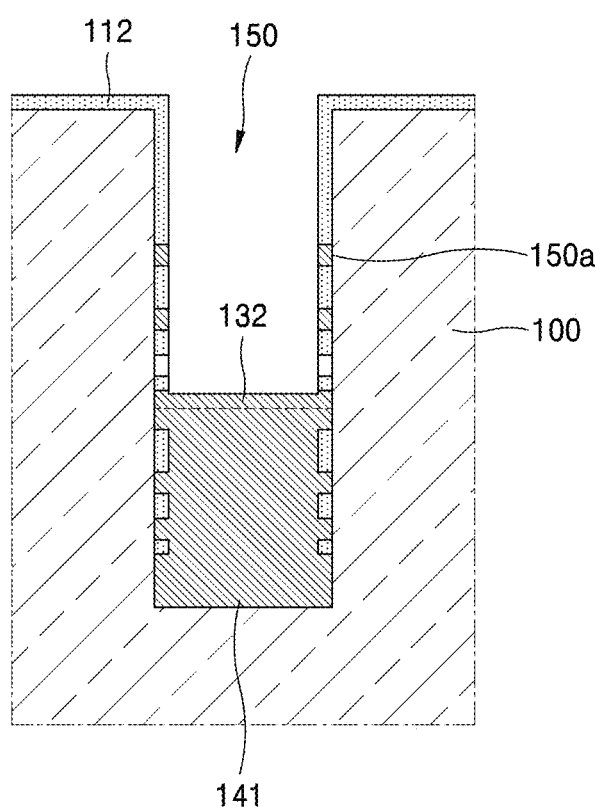

Next, referring to FIG. 8B, a second atomic layer 132 may be formed on the upper surface of the first filling layer 141 and the side wall 150*a* of the gap 150 around the first filling layer 141. The second atomic layer may be formed by having the second reactant adsorbed onto the second precursor layer. The second reactant may be a co-reactant and may include, for example, $H_2O$ or $O_2$. After the second precursor layer is formed, a purging process may be performed.

Figure 8C:
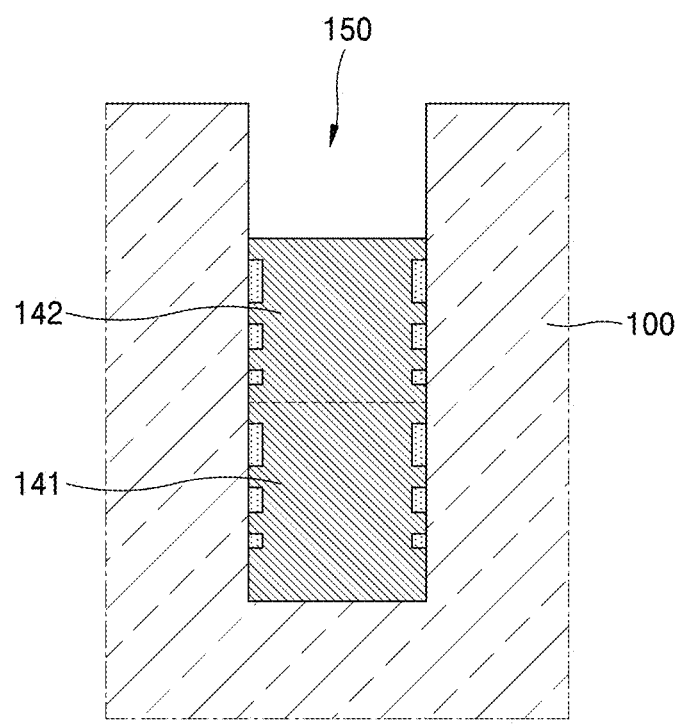

Next, referring to FIG. 8C, the second filling layer 142 may be formed above the first filling layer 141 to have a certain height, by repeatedly performing the adsorption of the first reactant and the adsorption of the second reactant described above for about dozens to hundreds of cycles. Here, the second filling layer 142 may be formed in a bottom-up direction from the upper surface of the first filling layer 141. As the adsorption of the first reactant and the adsorption of the second reactant are repeatedly performed, the amount of the second reaction inhibition layer 112 on the side wall 150*a* of the gap 150 may be gradually decreased.

Figure 9:
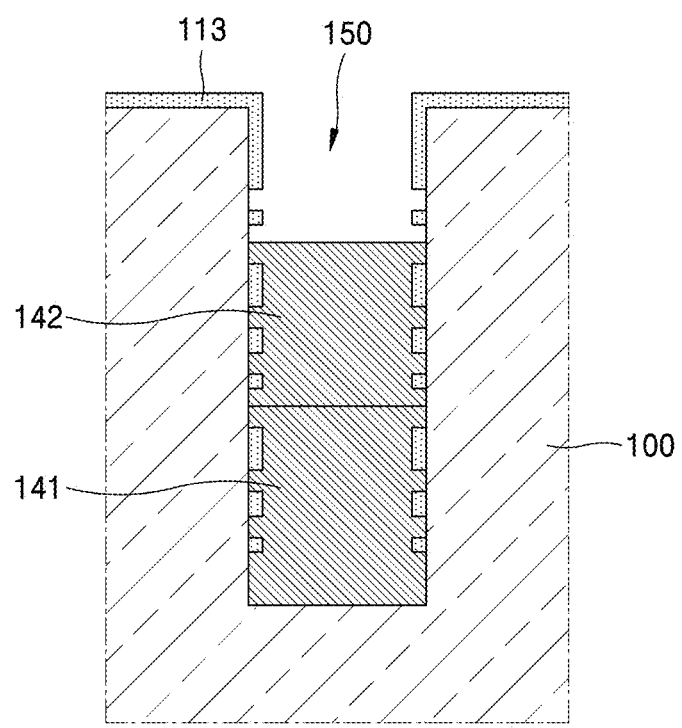

Referring to FIG. 9, the third reaction inhibition layer 113 may be formed on the side wall 150*a* of the gap 150. The third reaction inhibition layer 113 may be formed by having the reaction inhibitor adsorbed onto the side wall 150*a* of the gap 150. Here, the third reaction inhibition layer 113 may have a density gradient in which a density of the reaction inhibitor decreases from an entrance of the gap 150 toward the second filling layer 142. Thus, an upper surface of the second filling layer 142 and the side wall 150a of the gap 150 around the second filling layer 142 may not be covered by the third reaction inhibition layer 113 and may be exposed. After the third reaction inhibition layer 113 is formed, a purging process may be performed.

Figure 10A:
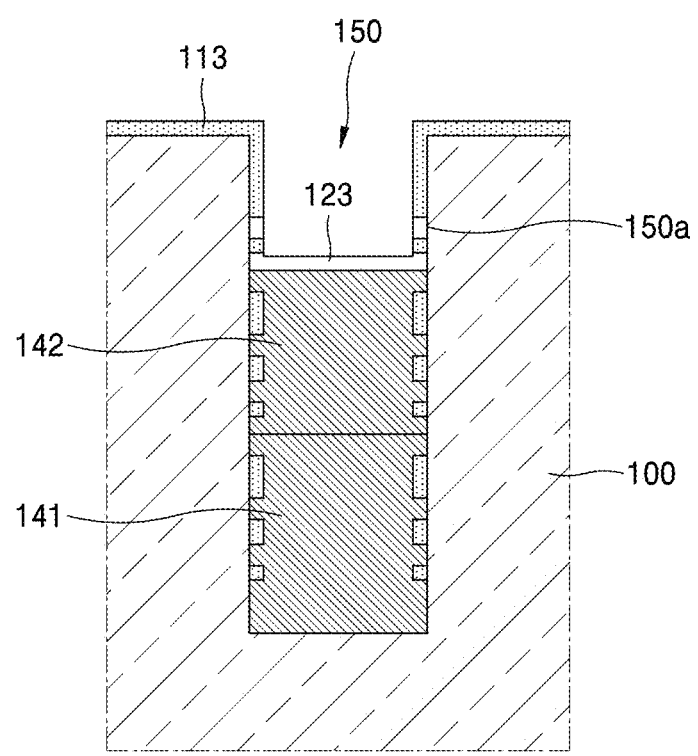
Figure 10B:
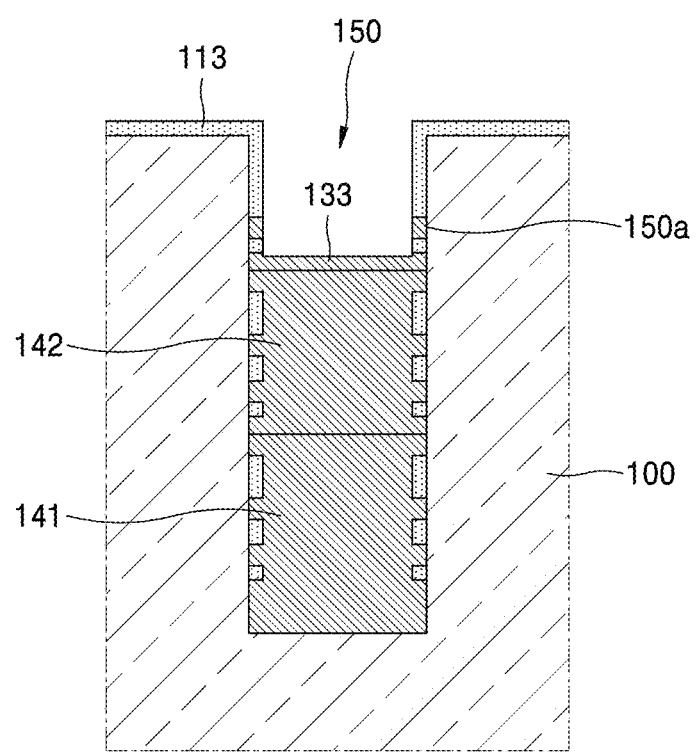

Referring to FIG. 10A, a third precursor layer 123 may be formed on the upper surface of the second filling layer 142 and the side wall 150a of the gap 150 around the second filling layer 142. The third precursor layer 123 may be formed by having the first reactant adsorbed onto the upper surface of the second filling layer 142 and the side wall 150a of the gap 150 around the second filling layer 142, which are exposed through the third reaction inhibition layer 113. After the third precursor layer is formed, a purging process may be performed. Next, referring to FIG. 10B, a third atomic layer 133 may be formed by having the second reactant adsorbed onto the third precursor layer. Thereafter, after the third atomic layer 133 is formed, a purging process may be performed.

Figure 10C:
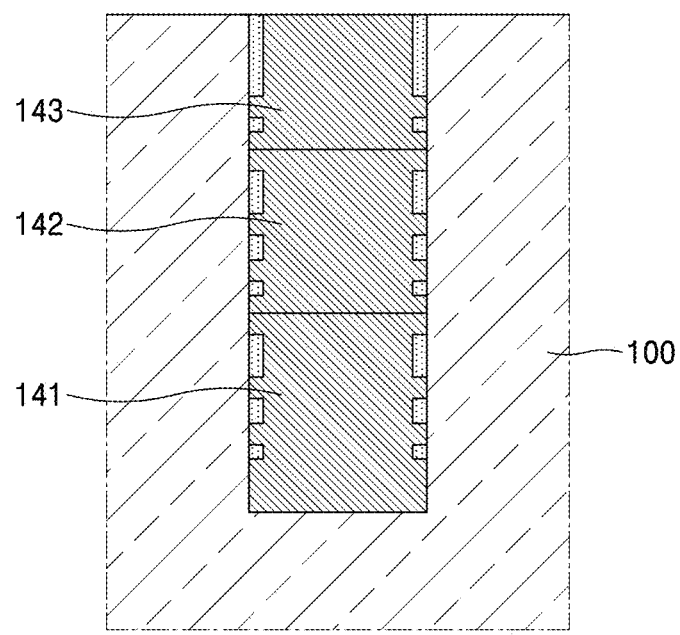

Referring to FIG. 10C, the third filling layer 143 may be formed above the second filling layer 142 to have a certain height, by repeatedly performing the adsorption of the first reactant and the adsorption of the second reactant described above for about dozens to hundreds of cycles. Here, the third filling layer 143 may be formed in a bottom-up direction from the upper surface of the second filling layer 142.

Accordingly, as the first through third filling layers 141 through 143 are sequentially formed in the gap 150, the bottom-up gap filling method, in which the filling materials fill in the gap 150 in the bottom-up direction from the bottom 150b of the gap 150, may be realized. In the gap filling process described above, the reaction inhibitor remaining in the gap 150 may be removed by being changed into the filling material via $O_3$ processing or $O_2$ plasma processing.

While FIGS. 1 to 10C illustrate an example where the gap 150 is filled with the first through third filling layers 141, 142, and 143, inventive concepts are not limited thereto. The number of filling layers to fill the gap 150 may be variously modified.

Figure 11:
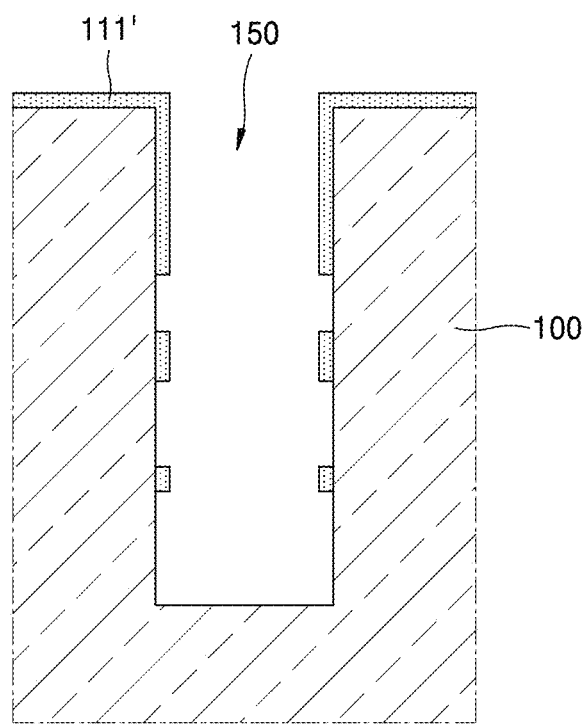
FIG. 11 illustrates an example of a reaction inhibitor layer formed in a method of filling a gap.

FIG. 11 illustrates another example of a reaction inhibitor layer 111' formed on the side wall 150a of the gap 150. FIG. 11 illustrates a case in which an average density of a reaction inhibitor included in the reaction inhibitor layer 111' is relatively lower than the case of FIG. 3.

Figure 12:
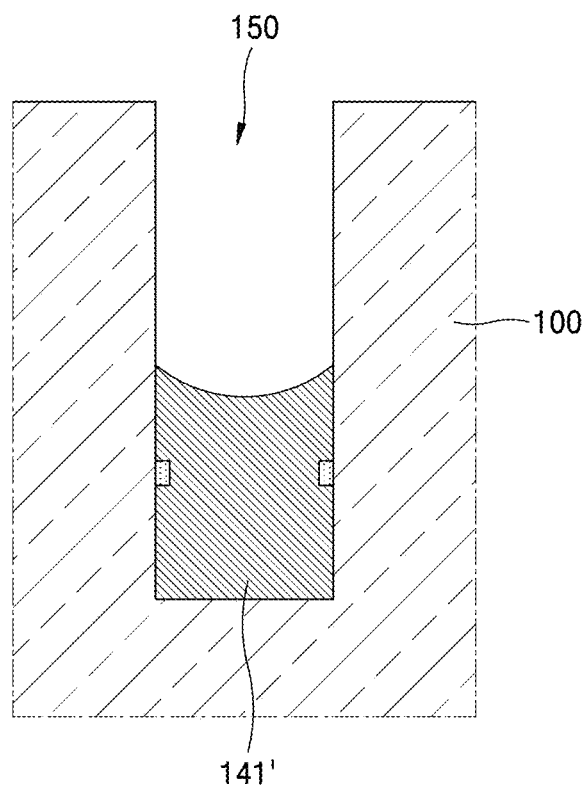
FIG. 12 illustrates an example of a first filling layer formed in a method of filling a gap.

Referring to FIG. 11, when the average density of the reaction inhibitor is relatively low, there may be a relatively less amount of reaction inhibitors on the side wall 150a around the bottom 150b of the gap 150. In this case, the first filling layer 141' may be formed not only on the bottom 150b of the gap 150, but also on the side wall 150a around the bottom 150b of the gap 150. Thus, the first filling layer 141' may be formed to have a shape in which a central portion of an upper surface of the first filling layer 141' is downwardly convex as illustrated in FIG. 12. In other words, as shown in FIG. 12, an upper surface of the first filling layer 14T may be concave. In this process, a speed at which the first filling layer 141' is formed may be higher than a speed at which the first filling layer 141 is formed in FIG. 6.

As described above, according to the average density of the reaction inhibitor adsorbed onto the side wall 150a of the gap 150, a shape in which the first filling layer 141' is formed in the gap 150 may be changed, and according to the shape in which the first filling layer 141' is formed, a gap filling process time may be adjusted. In detail, when the average density of the reaction inhibitor adsorbed onto the side wall 150a of the gap 150 is decreased, a speed at which the first filling layer 141' is formed may be increased, and thus, the gap filling process time may be reduced.

According to the present embodiment, the precursor material not reacting with the co-reactant, such as $H_2O$ or $O_2$, which is to be used in the sequential ALD process, may be used as the reaction inhibitor, and the density gradient in which the density of the reaction inhibitor decreases from the entrance of the gap 150 toward the bottom 150b of the gap 150 may be formed, thereby realizing bottom-up gap filling whereby the gap 150 is filled with the filling materials in the bottom-up direction from the bottom 150b of the gap 150.

Also, the reaction inhibitor may include the precursor material having the same center metal as the precursor for forming the thin layer used in the sequential ALD process, and thus, the invagination of impurities may be limited and/or prevented.

Hereinafter, the adsorption characteristics, the reactivity, and the blocking characteristics of the reaction inhibitor TiCp*(OMe)$_3$ will be identified based on experiments.

Experimental Example 1> the Adsorption Characteristics of the Reaction Inhibitor As the reaction inhibitor, TiCp*(OMe)$_3$ is used, and as a substrate on which the adsorption is performed, a $SiO_2$ substrate is used. An ALD process using TiCp*(OMe)$_3$ is performed on the $SiO_2$ substrate. In this process, a temperature of a canister containing TiCp*(OMe)$_3$ is about 70° C. and a temperature of a reaction chamber is maintained as 180° C.

A cyclic process of the adsorption of the reaction inhibitor may include exposure of the $SiO_2$ substrate to the reaction inhibitor for a certain period of time for the adsorption of the reaction inhibitor onto the $SiO_2$ substrate and removing a remaining reaction inhibitor not engaged in the reaction through a purging process. Here, sample cases in which the exposure time of the reaction inhibitor corresponds to 5 seconds (s), 10 s, 15 s, and 20 s are described.

Whether or not the adsorption of TiCp*(OMe)$_3$ onto the $SiO_2$ substrate is performed may be determined by measuring a contact angle. Here, the contact angle indicates a water contact angle (WCA). The WCA is the angle formed tangential to a water droplet at an air-liquid-solid interface. The $SiO_2$ substrate may have a hydrophilic surface when no additional surface processing is performed on the $SiO_2$ substrate. Thus, the $SiO_2$ substrate may have relatively high surface energy, and accordingly, may have a relatively small contact angle. When the reaction inhibitor is not adsorbed onto the $SiO_2$ substrate, a contact angle on the $SiO_2$ substrate is measured as 49.2 degrees. By increasing the exposure time of the reaction inhibitor, the contact angle increases. When the exposure time of the reaction inhibitor is 15 s, the contact angle has the greatest value of 99.5 degrees, and in this case, it may be determined that the reaction inhibitor is completely adsorbed onto the $SiO_2$ substrate. Meanwhile, the contact angle slightly decreases when the exposure time of the reaction inhibitor is increased to be longer than 15 s. In the sample case in which the exposure time of the reaction inhibitor is 15 s, after 40 hours, the contact angle remains to be 96.9 degrees, to show that TiCp*(OMe)s has adsorption stability.

Experimental Example 2> the Reactivity of the Reaction Inhibitor

The reactivity between TiCp*(OMe)s and a co-reactant is identified by performing an ALD process. Here, the ALD process is performed by using TiCp*(OMe)s as a Ti precursor and H$_2$O as the co-reactant at a temperature of 180° C. When a thickness change is detected after performing the ALD process, it indicates that a TiO$_2$ thin layer is formed by the reaction between TiCp*(OMe)s and H$_2$O.

Sample cases in which the exposure time of TiCp*(OMe)sis 1 s, 5 s, 10 s, 15 s, and 20 s are described. As a result of the comparison with a bare substrate according to the exposure time of TiCp*(OMe)s, almost not thickness change is detected. This aspect indicates that a TiO$_2$ thin layer is not formed and from this, it is identified that TiCp*(OMe)$_3$ has no reactivity with H$_2$O. Thus, when TiCp*(OMe)$_3$ is used as the reaction inhibitor, the reaction inhibitor has no reactivity with H$_2$O.

Experimental Example 3> the Blocking Characteristics of the Reaction Inhibitor

First, an ALD process is performed at a temperature of 180° C. by using TDMAT as a Ti precursor on a Si substrate and H$_2$O as a co-reactant. Conditions of a cycle of the ALD process used here include TDMAT (1 s)—N$_2$ Purge (60 s)—H$_2$O (30 s)—N$_2$ Purge (60 s). The ALD process is performed for 250 cycles and a TiO$_2$ thin layer having a thickness of 10 nm is formed on the Si substrate. A contact angle measured on the TiO$_2$ thin layer is 59.6 degrees.

Next, a first sample is prepared by coating the TiO$_2$ thin layer, formed by the ALD process described above, with the reaction inhibitor TiCp*(OMe)s by exposing the TiO$_2$ thin layer to TiCp*(OMe)$_3$ for 15 s. A contact angle measured after the reaction inhibitor is coated is measured to be 99.1 degrees, and thus, it is identified that a surface state is changed. Also, a second sample is provided, in which no processing is performed on the TiO$_2$ thin layer formed by the ALD process described above.

Thereafter, the ALD process described above is performed again on each of the first sample and the second sample. In the second sample in which the reaction inhibitor is not coated, a TiO$_2$ thin layer having a thickness of 10 nm is additionally deposited and a contact angle is measured to be substantially the same as the contact angle of the TiO$_2$ thin layer previously formed. In the first sample in which the reaction inhibitor is coated, a contact angle is measured to be 93.5 degrees, which is greater than the contact angle of the TiO$_2$ thin layer. That is, in the first sample in which the reaction inhibitor is coated, a TiO$_2$ thin layer is not formed and the reaction inhibitor remains to be coated. Thus, it is shown that when TiCp*(OMe)sis used as the reaction inhibitor, the reaction inhibitor has excellent blocking characteristics.

FIGS. 13 through 20 are views for describing a method of filling a gap, according to another example embodiment. The method of filling the gap, according to the present embodiment, is the same as the method of filling the gap, according to the embodiment described above, except for a process in which a first filling layer (241 of FIG. 14) is previously formed in a gap 250.

Figure 13:
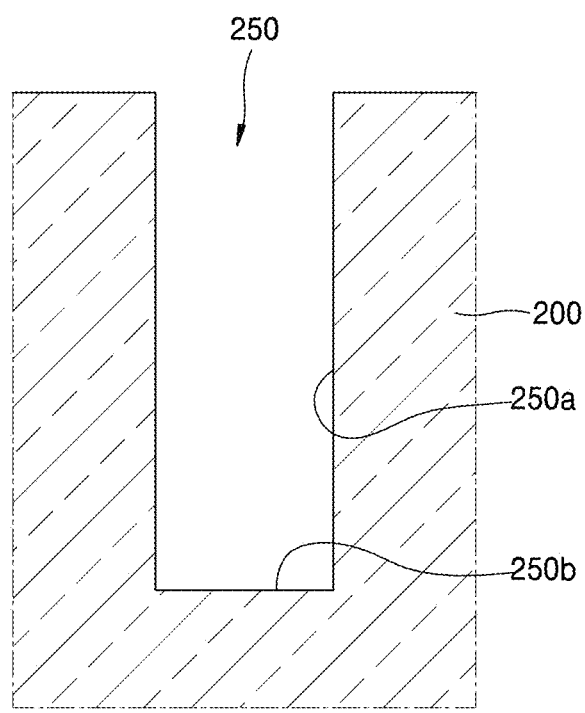
FIGS. 13 through 20 are views for describing a method of filling a gap according to other example embodiments.

Referring to FIG. 13, a substrate 200 including the gap 250 may be disposed in a reaction chamber (not shown) of an ALD apparatus. Here, the gap 250 may have a high aspect ratio of about 10 or more, but is not limited thereto.

Figure 14:
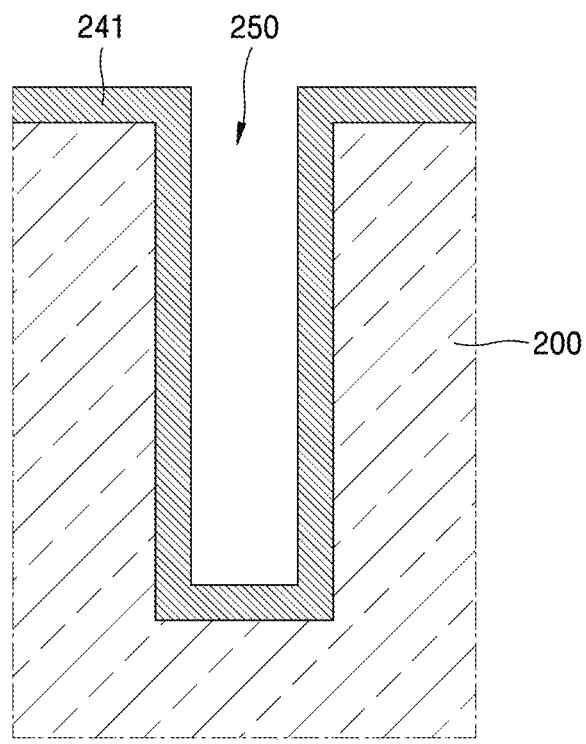

Referring to FIG. 14, the first filling layer 241 may be formed to have a certain thickness on a side wall 250a and a bottom 250b of the gap 250 by using an ALD process. First, a precursor layer (not shown) may be formed by having a first reactant be adsorbed onto the side wall 250a and the bottom 250b of the gap 250. The first reactant may include a precursor material of a thin layer to be formed. For example, the first reactant may include TiCl$_4$, Ti(O$^i$Pr)$_4$, Ti(NMe$_2$)$_4$, Ti(NMeEt)$_4$, Ti(NEt$_2$)$_4$, ZrCl$_4$, Zr(NMe$_2$)$_4$, Zr(O$^i$Bu)$_4$, ZrCp$_2$Me$_2$, Zr(MeCp)$_2$(OMe)Me, HfCl$_4$, Hf(NMe$_2$)$_4$, Hf(NEtMe)$_4$, Hf(NEt$_2$)$_4$, HfCp2Me$_2$, or Hf(MeCp)$_2$(OMe)Me. However, the first reactant is not limited thereto. After the first precursor layer is formed, a purging process may be performed.

Thereafter, an atomic layer (not shown) may be formed by having a second reactant be adsorbed onto the precursor layer. The atomic layer may be formed via reaction between the first reactant and the second reactant. The second reactant may be a co-reactant and may include, for example, H$_2$O or O$_2$. Also, a purging process may be performed after the first precursor layer is formed.

The first filling layer 241 may be formed to have a certain thickness on the side wall 250a and the bottom 250b of the gap 250 by repeatedly performing the adsorption of the first reactant and the adsorption of the second reactant described above for about dozens to hundreds of cycles. Here, one cycle may include adsorption of the first reactant, purging, adsorption of the second reactant, and purging. The first filling layer 241 may include, for example, oxide, nitride, or metals, but is not limited thereto.

Figure 15:
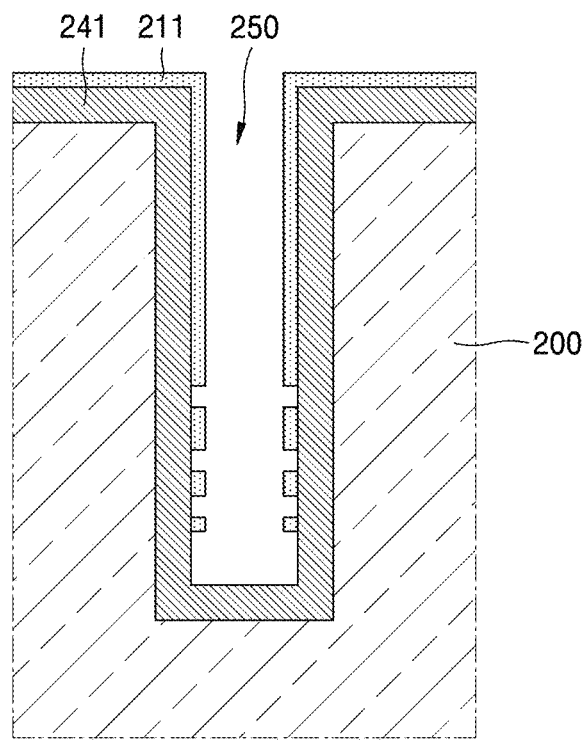

Referring to FIG. 15, a first reaction inhibition layer 211 may be formed on the first filling layer 241 formed on the side wall 250a of the gap 250. The first reaction inhibition layer 211 may be formed by having a reaction inhibitor be adsorbed onto the first filling layer 241 formed on the side wall 250a of the gap 250. Here, the reaction inhibitor may include a precursor material not reacting with the second reactant, which is the co-reactant. Materials of the reaction inhibitor are described above, and thus, they will not be described again.

The first reaction inhibition layer 211 may have a density gradient in which a density of the reaction inhibitor decreases from an entrance of the gap 250 toward a bottom 250b of the gap 250. Here, the density gradient of the first reaction inhibition layer 211 may be determined according to Equation 1 described above. Accordingly, the first filling layer 241 formed on the bottom 250b of the gap 250 and around the first filling layer 241 may not be covered by the first reaction inhibition layer 211 and may be exposed. The density gradient of the first reaction inhibition layer 211 is described above, and thus, its description will be omitted. After the first reaction inhibition layer 211 is formed, a purging process for discharging materials remaining in the reaction chamber to the outside may be performed.

Figure 16:
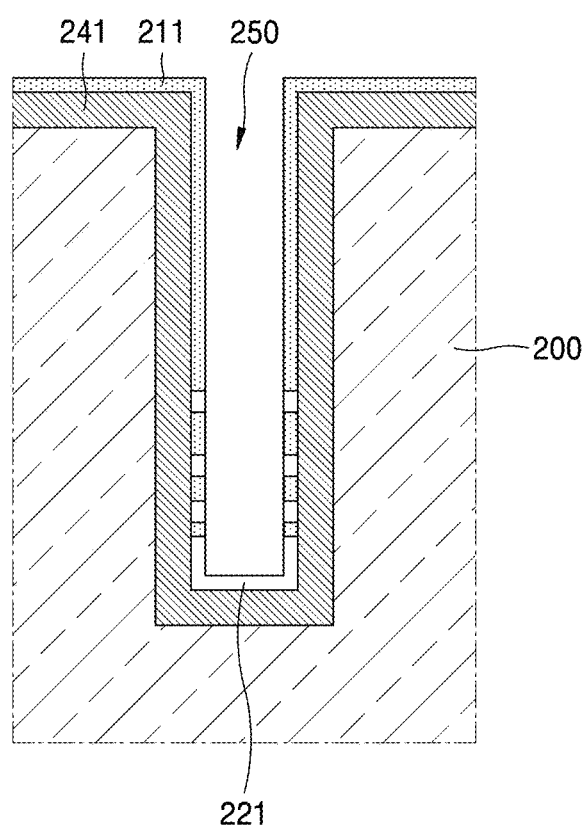

Referring to FIG. 16, a first precursor layer 221 may be formed on and around the first filling layer 241 formed on the bottom 250b of the gap 250. The first precursor layer 221 may be formed by having the first reactant adsorbed onto and around the first filling layer 241 formed on the bottom 250b of the gap 250. The first filling layer 241 formed on the bottom 250b of the gap 250 and a region around the first filling layer 241 may not be coated with the first reaction inhibition layer 211 and may be exposed. The first reactant may be adsorbed onto the exposed first filling layer 241 and the exposed region around the first filling layer 241 to form the first precursor layer 221.

The first reactant may include a precursor material of a thin layer to be formed. For example, the first reactant may include $TiCl_4$, $Ti(O^iPr)_4$, $Ti(NMe_2)_4$, $Ti(NMeEt)_4$, $Ti(NEt_2)_4$, $ZrCl_4$, $Zr(NMe_2)_4$, $Zr(O^iBu)_4$, $ZrCp_2Me_2$, $Zr(MeCp)_2(OMe)Me$, $HfCl_4$, $Hf(NMe_2)_4$, $Hf(NEtMe)_4$, $Hf(NEt_2)_4$, $HfCp2Me_2$, or $Hf(MeCp)_2(OMe)Me$, but is not limited thereto. After forming the first precursor layer 221, a purging process may be performed.

Figure 17:
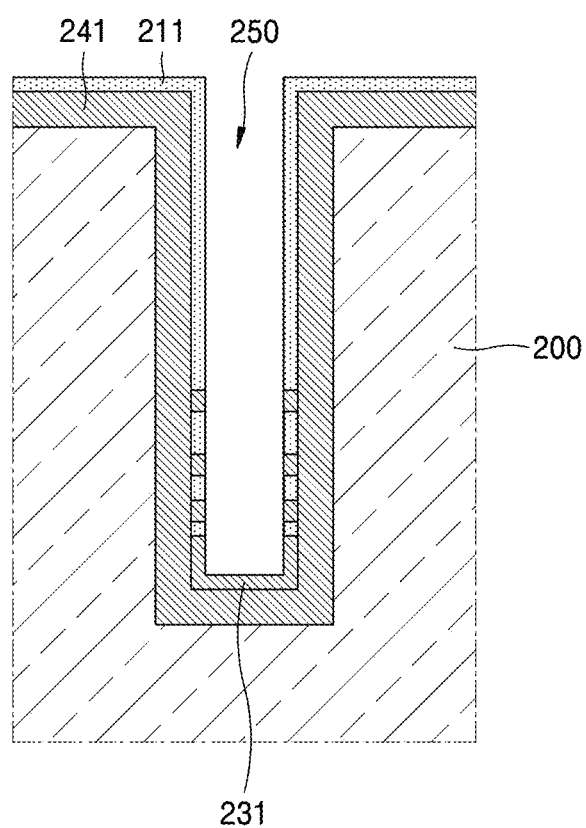

Referring to FIG. 17, a first atomic layer 231 may be formed on and around the first filling layer 241 formed on the bottom 250b of the gap 250. The first atomic layer 231 may be formed by having the second reactant adsorbed onto and around the first filling layer 241 formed on the bottom 250b of the gap 250. The second reactant may be a co-reactant and may include, for example, $H_2O$ or $O_2$. The first atomic layer 231 may include oxide, nitride, or metals, but is not limited thereto. After the first atomic layer 231 is formed, a purging process may be performed.

Figure 18:
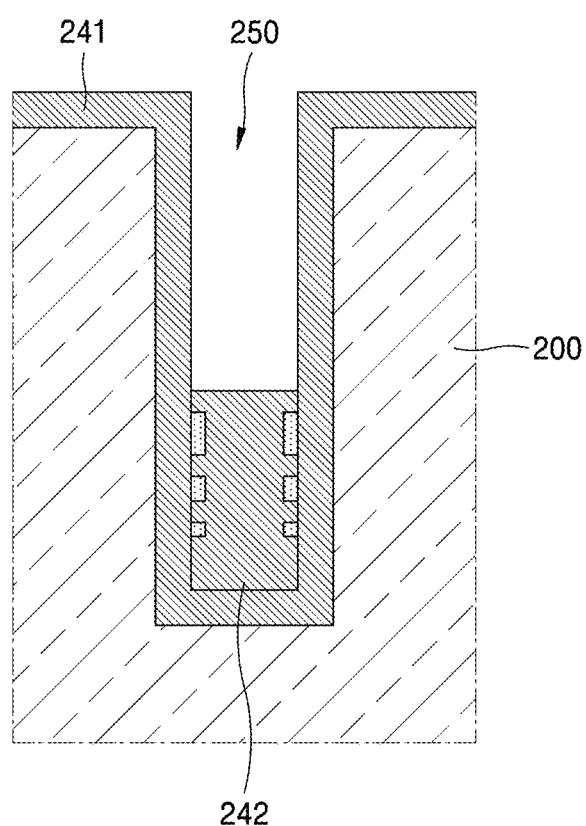

Referring to FIG. 18, a second filling layer 242 may be formed on the first filling layer 241 to have a certain height by repeatedly performing the adsorption of the first reactant and the adsorption of the second reactant described above for about dozens to hundreds of cycles. Here, one cycle may include adsorption of the first reactant, purging, adsorption of the second reactant, and purging. The second filling layer 242 may be formed in a bottom-up direction from an upper surface of the first filling layer 241. As the adsorption of the first reactant and the adsorption of the second reactant are repeatedly performed, the amount of the first reaction inhibition layer 211 on the side wall 250a of the gap 250 may be gradually decreased.

Figure 19:
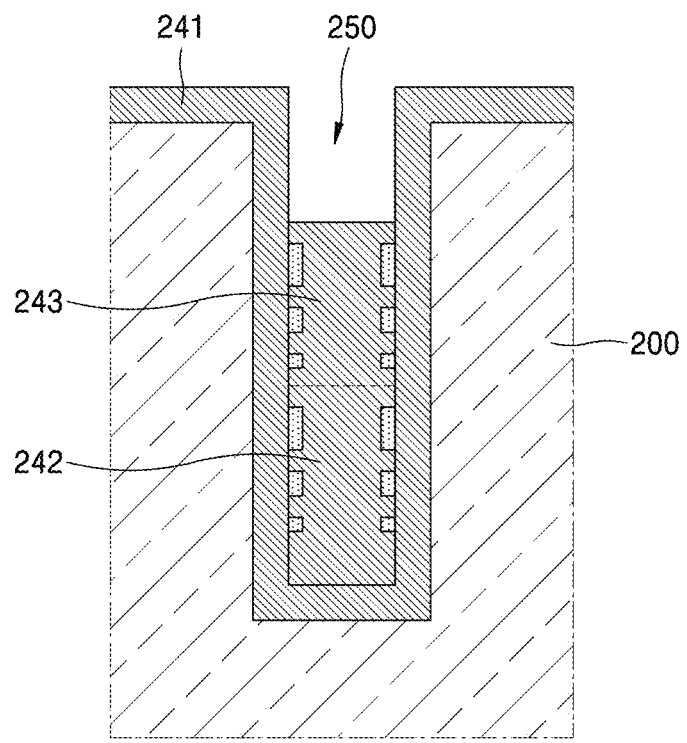

Referring to FIG. 19, a second reaction inhibition layer (not shown) may be formed on the first filling layer 241 formed on the side wall 250a of the gap 250. The second reaction inhibition layer may be formed by having a reaction inhibitor be adsorbed onto the first filling layer 241 formed on the side wall 250a of the gap 250. After the second reaction inhibition layer is formed, a purging process may be performed.

Next, after forming a second precursor layer (not shown) by having the first reactant be adsorbed onto and around an upper surface of the second filling layer 242, a purging process may be performed. Also, after forming a second atomic layer (not shown) by having the second reactant be adsorbed onto the second precursor layer, a purging process may be performed.

A third filling layer 243 may be formed on the second filling layer 242 to have a certain height, by repeatedly performing the adsorption of the first reactant and the adsorption of the second reactant described above for about dozens to hundreds of cycles. Here, the third filling layer 243 may be formed in a bottom-up direction from the upper surface of the second filling layer 242. As the adsorption of the first reactant and the adsorption of the second reactant are repeatedly performed, the amount of the second reaction inhibition layer on the first filling layer 241 formed on the side wall 250a of the gap 250 may be gradually decreased.

Figure 20:
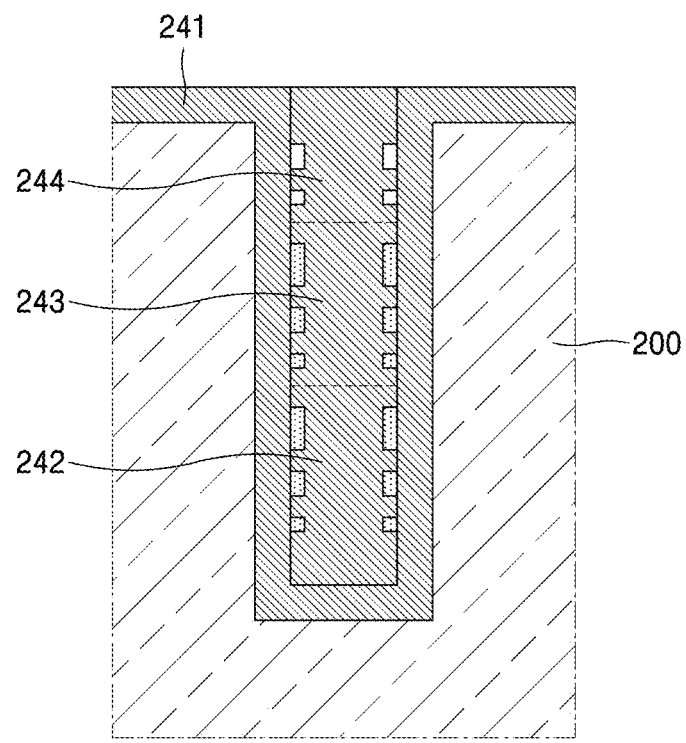

Referring to FIG. 20, a third reaction inhibition layer (not shown) may be formed on the first filling layer 241 formed on the side wall 250a of the gap 250. The third reaction inhibition layer may be formed by having the reaction inhibitor adsorbed onto the first filling layer 241 formed on the side wall 250a of the gap 250. After the third reaction inhibition layer is formed, a purging process may be performed.

Next, after forming a second precursor layer (not shown) by having the first reactant be adsorbed onto and around an upper surface of the third filling layer 243, a purging process may be performed. Also, after forming a second atomic layer (not shown) by having the second reactant be adsorbed onto the second precursor layer, a purging process may be performed.

A fourth filling layer 244 may be formed on the third filling layer 243 to have a certain height, by repeatedly performing the adsorption of the first reactant and the adsorption of the second reactant described above for about dozens to hundreds of cycles. Here, the fourth filling layer 244 may be formed in a bottom-up direction from the upper surface of the third filling layer 243.

According to the present embodiment, the first filling layer 241 may be previously formed to have a certain thickness on the side wall 250a and the bottom 250b of the gap 250, and then, the second through fourth filling layers 242 through 244 may be sequentially formed in the gap 250. Thus, the processing time required for the gap-filling process may be reduced.

Hereinafter, an ALD apparatus for performing the method of filling the gap according to the embodiments described above at a high speed will be described.

Figure 21:
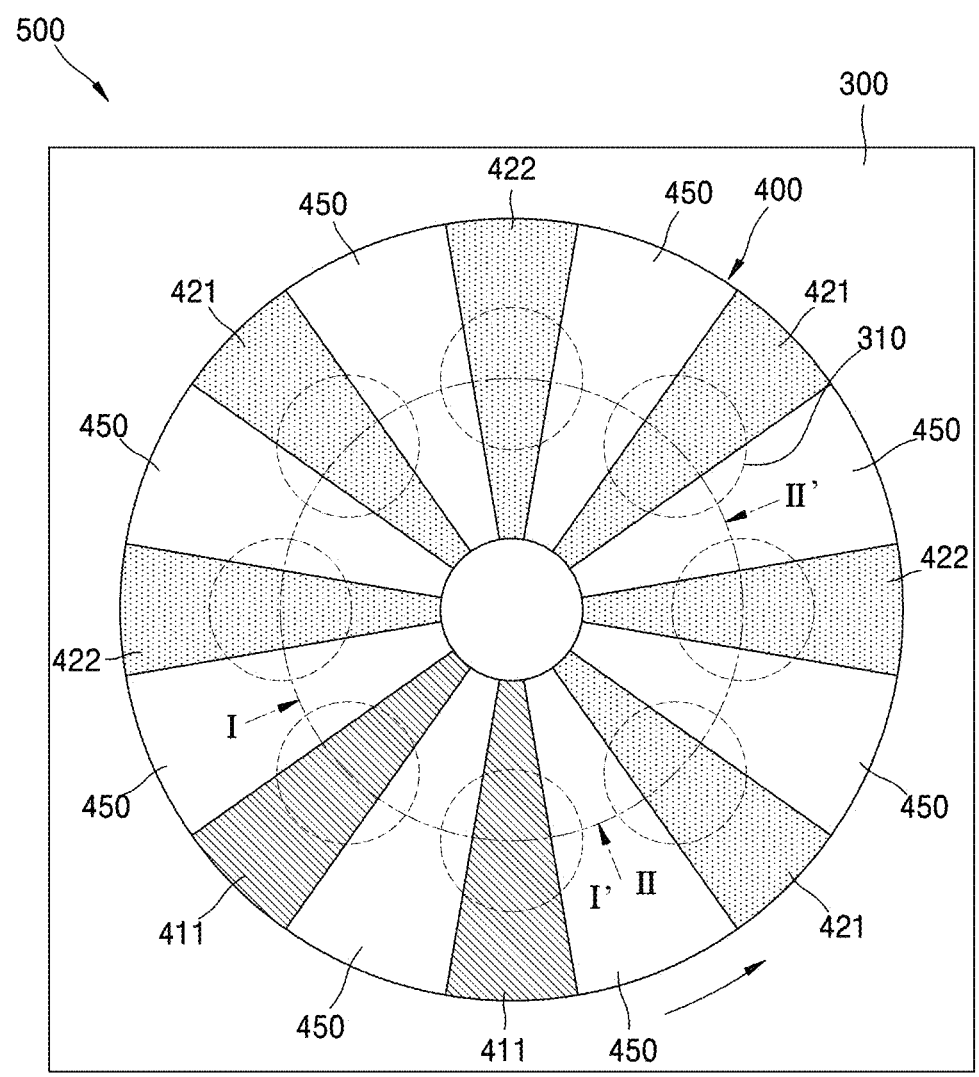
FIG. 21 is a schematic plan view of an atomic layer deposition (ALD) apparatus according to an example embodiment.
Figure 22:
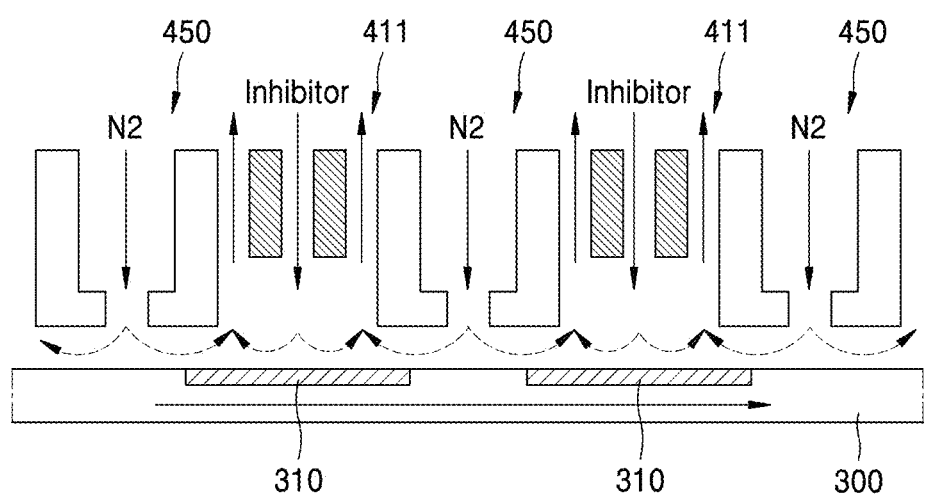
FIG. 22 is a cross-sectional view of an ALD apparatus of FIG. 21, taken along line I-I' of FIG. 21.
Figure 23:
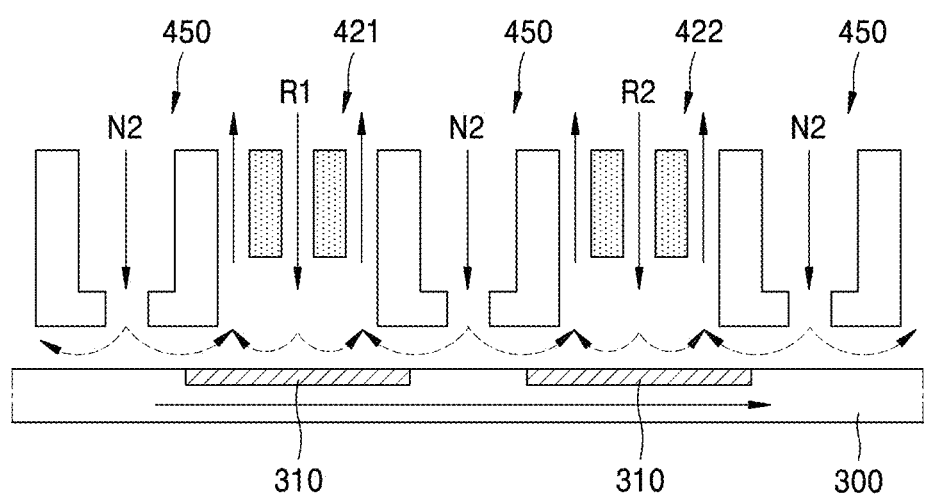
FIG. 23 is a cross-sectional view of an ALD apparatus of FIG. 21, taken along line II-II' of FIG. 21.

FIG. 21 is a schematic plan view of an ALD apparatus 500 according to an example embodiment. FIG. 22 is a cross-sectional view of the ALD apparatus 500 of FIG. 21, taken along line I-I' of FIG. 21, and FIG. 23 is a cross-sectional view of the ALD apparatus 500 of FIG. 21, taken along line II-II' of FIG. 21.

Referring to FIG. 21, the ALD apparatus 500 may include a substrate 300 and a reactant supply device 400 on the substrate 300. A plurality of processing areas 310 may be provided on the substrate 300, and at least one gap (not shown) to be filled may be formed on each of the processing areas 310. For example, the plurality of processing areas 310 may include a plurality of wafers provided on the substrate 300. The plurality of processing areas 310 may be arranged to have a circular shape externally surrounding the substrate 300. FIG. 21 illustrates an example in which eight processing areas 310 are provided on the substrate 300. However, the number of processing areas provided on the substrate 300 is not limited thereto and may be variously modified.

The reactant supply device 400 may be configured to fill the gaps by supplying a reactant on the processing areas 310 of the substrate 300 and may include at least one first supply unit 411, at least one second supply unit 421, and at least one third supply unit 422. The first supply unit 411, second supply unit 421, and third supply unit 422 may each include one or more canisters for storing a reactant and the reactant supply device may include conduits (e.g., piping) and pumping systems for supplying the reactant and/or reaction inhibitor to the processing areas 310 of the substrate 300. The substrate 300 and the reactant supply device 400 may be provided to be relatively rotatable. In general, the reactant supply device 400 may be fixed and the substrate 300 may be rotatable. For example, the substrate 300 may be on a platform and secured with for example an electrostatic chuck, clamp and a motor may be configured to rotate the platform. However, the disclosure is not limited thereto. The substrate 300 may be fixed on a platform and the reactant supply device 400 may be rotatable. For example, a motor may be configured to rotate the reactant supply device.

The at least one first supply unit 411, the at least one second supply unit 421, and the at least one third supply unit 422 may be arranged to have a circular shape along the plurality of processing areas 310. Also, each of purging units 450 may be provided between the first through third supply units 411, 421, and 422. The purging units 450 may include containers (e.g., canisters) for storing a purging gas (e.g., $N_2$, argon) and pumping systems for supplying the purging gas to areas of the ALD apparatus 500 between the processing areas 310. FIG. 21 illustrates an example in which the reactant supply device 400 includes two first supply units 411, three second supply units 421, and three third supply units 422, and the purging unit 450 is provided between the first through third supply units 411,421, and 422. However, the disclosure is not limited thereto, and the numbers of first through third supply units 411,421, and 422 may be variously modified.

Each processing area 310 on the substrate 300 may be supplied with a reaction inhibitor, a first reactant, and a second reactant via rotation from the first through third supply units 411,421, and 422. Thus, the gaps formed in the processing areas 310 may be filled in the bottom-up direction as described above.

FIG. 22 illustrates that a reaction inhibitor is supplied to each processing area 310. Referring to FIG. 22, the first supply unit 411 may supply the reaction inhibitor to each processing area 310 of the substrate 300, which rotates, so that a reaction inhibition layer may be formed on a side wall of the gap. The reaction inhibitor may include, for example, a precursor material not reacting with $H_2O$ or $O_2$. This aspect is described above, and thus, its description will be omitted.

FIG. 22 illustrates the example in which the two first supply units 411 supply the reaction inhibitor. However, the disclosure is not limited thereto, and only one of the two first supply units 411 may supply the reaction inhibitor.

The purging unit 450 may be provided around each of the first supply units 411. While the first supply units 411 supply the reaction inhibitor to the processing areas 310, the purging units 450 may supply a purging gas, such as a $N_2$ gas, between the processing areas 310.

The reaction inhibition layer formed on the side wall of the gap may have a density gradient in which the density of the reaction inhibitor decreases toward the bottom of the gap as described above. To this end, the exposure time of the processing area 310 to the reaction inhibitor may have to be controlled. The exposure time may be controlled via adjusting a rotation speed and the number of rotations of the substrate 300.

FIG. 23 illustrates that after the reaction inhibition layer is formed, a first reactant R1 and a second reactant R2 are supplied to each processing area 310. Referring to FIG. 23, the second supply unit 421 may supply the first reactant R1 to each processing area 310 so as to form a precursor layer at a bottom of the gap and around the gap. The first reactant R1 may include a precursor material of a thin layer to be formed. Also, the third supply unit 422 may supply the second reactant to each processing area 310. Here, the second reactant R2 may be a co-reactant and may include, for example, $H_2O$ or $O_2$. Thus, the second reactant R2 may react with the precursor layer so as to form an atomic layer at the bottom of the gap and around the gap.

The supply of the first and second reactants R1 and R2 as described above may be simultaneously performed on the processing areas 310 of the substrate 300 by the second and third supply units 421 and 422. During this process, in order to limit and/or prevent the mixing of the first reactant R1 with the second reactant R2, the purging unit 450 provided around each of the second and third supply units 421 and 422 may supply a purging gas between the processing areas 310.

As described above, inner portions of the gaps formed in the processing areas 310 may be filled at a high speed by repeatedly supplying the first and second reactants R1 and R2 to the processing areas 310 of the substrate 300, which rotates. Also, because the substrate 300 includes the plurality of processing areas 310 that are spatially divided, and the gap-filling operation may be simultaneously performed for the plurality of processing areas 310, the processing time may be reduced. While one or more embodiments have been described, it will be understood by one of ordinary skill in the art that various changes in form and details may be made therein without departing from the spirit and scope as defined by the following claims.

According to the example embodiment described above, the precursor material not reacting with the co-reactant, such as $H_2O$ or $O_2$, used in the sequential ALD process, may be used as the reaction inhibitor, and the density gradient in which the density of the reaction inhibitor decreases from the entrance of the gap toward the bottom of the gap may be formed, thereby realizing bottom-up gap filling, whereby the gap is filled with the filling materials in a bottom-up direction.

Also, the reaction inhibitor may be formed by using the precursor material having the same center metal as the precursor for forming the thin layer to be used in the sequential ALD process, and thus, invagination of impurities may be limited and/or prevented. The reaction inhibitor may be converted into the filling material via $O_3$ or $O_2$ plasma processing to be easily removed. Also, after previously forming a filling layer on the side wall and the bottom of the gap to have a certain thickness, other filling layers may be sequentially formed in the gap. Thus, the time required for the gap-filling may be reduced.

The method of filing the gap according to the embodiments described above may be applied as a manufacturing technique of various devices including an optical device, a semiconductor device, etc. requiring a high precision and a high aspect ratio. Hereinafter, examples of various devices realized by using the method of filling the gap described above will be described.

Figure 24A:
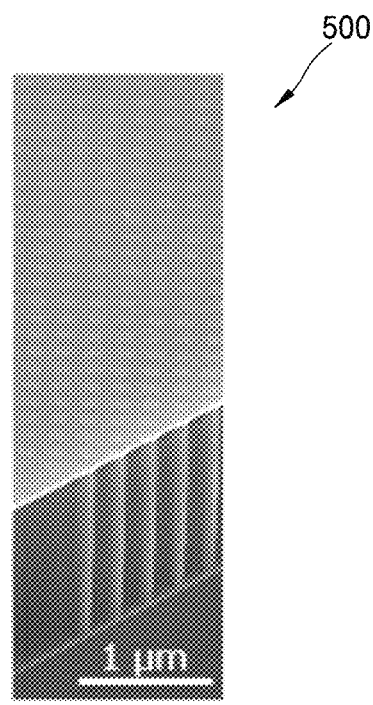
FIGS. 24A through 24C illustrate a meta-lens according to an example embodiment.
Figure 24B:
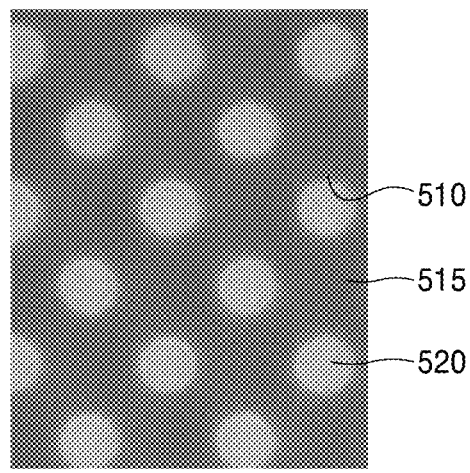
Figure 24C:
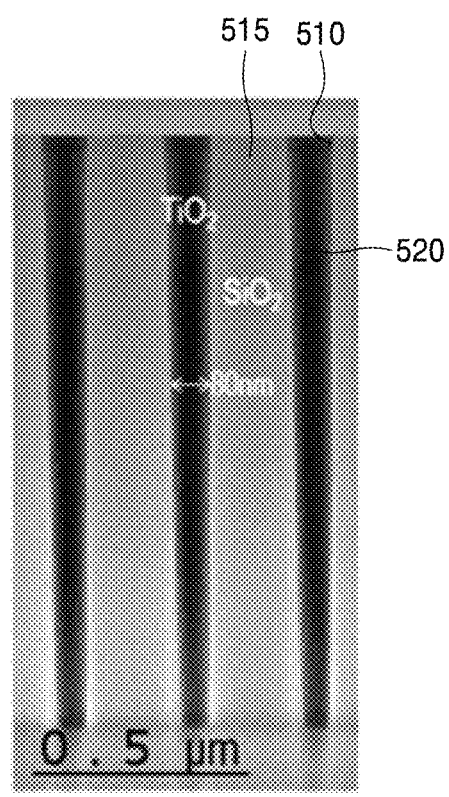

FIGS. 24A through 24C are electron microscope images illustrating a meta-lens 500 (in detail, a visible meta-lens) according to an example embodiment. FIGS. 24B and 24C are an inside plan view and an inside cross-sectional view of the meta-lens 500, respectively.

Referring to FIGS. 24A through 24C, the meta-lens 500 may include: a nanostructure 515 including a plurality of gaps 510; and filing layers 520 provided to fill the plurality of gaps 510. Here, the filling layer 520 may include a high refractive dielectric material having a higher refractive index than a material of the nanostructure 515. For example, the nanostructure 515 may include $SiO_2$, and the filling layer 520 may include $TiO_2$.

Each of the gaps 510 may have a nano-sized width. For example, each of the gaps 510 may have an aspect ratio that is equal to or greater than about 10. By using the gap filling technique as described above, inner spaces of the gaps 510 having the high aspect ratio may be filled with the filling layers 520 without defects such as a void, etc.

Figure 25:
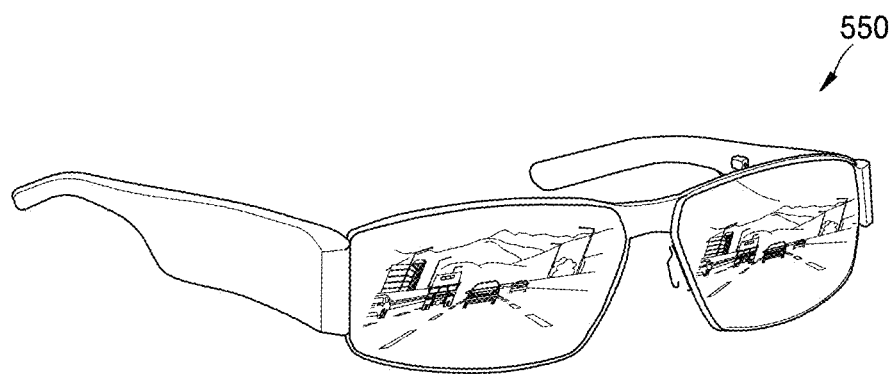
FIG. 25 illustrates augmented reality (AR) glasses as an example of a near-eye display device.

The meta-lens 500 described above may be applied to various devices, such as a near-eye display device, a smartphone, a drone, etc. FIG. 25 illustrates augmented reality (AR) glasses 550 as an example of the near-eye display device.

Figure 26:
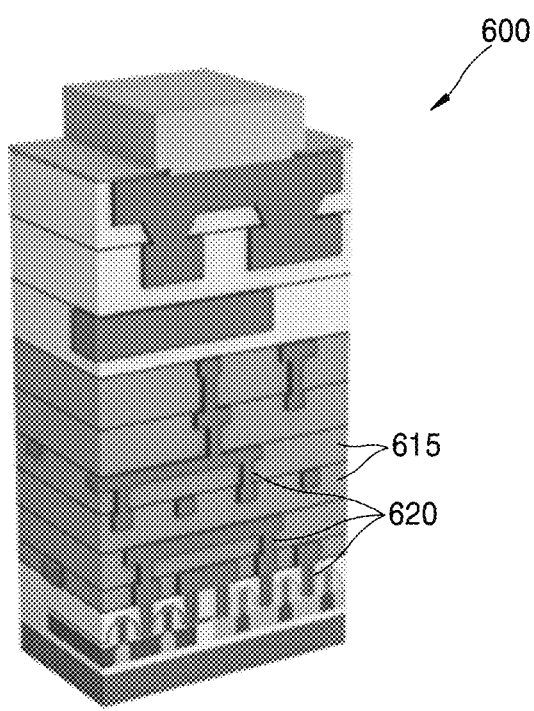
FIG. 26 illustrates an example of a dynamic random-access memory (DRAM) device including an interconnect structure according to an example embodiment.

FIG. 26 illustrates an example 600 of a dynamic random-access memory (DRAM) device including an interconnect structure according to an example embodiment.

Referring to FIG. 26, the interconnect structure of the DRAM device 600 may include an insulating layer 615 in which a plurality of gaps having a high aspect ratio are formed, and filling layers 620 provided to fill the plurality of gaps. Here, the insulating layer 615 may include, for example, an interlayer dielectric (ILD), an inter-metal dielectric (IMD), etc. Also, the filling layer 620 may include a highly conductive metal material.

By filling the conductive material in each of the gaps having the high aspect ratio in the interconnect structure, by using the gap filling technique described above, the seamless interconnects that have no voids may be formed.

Figure 27:
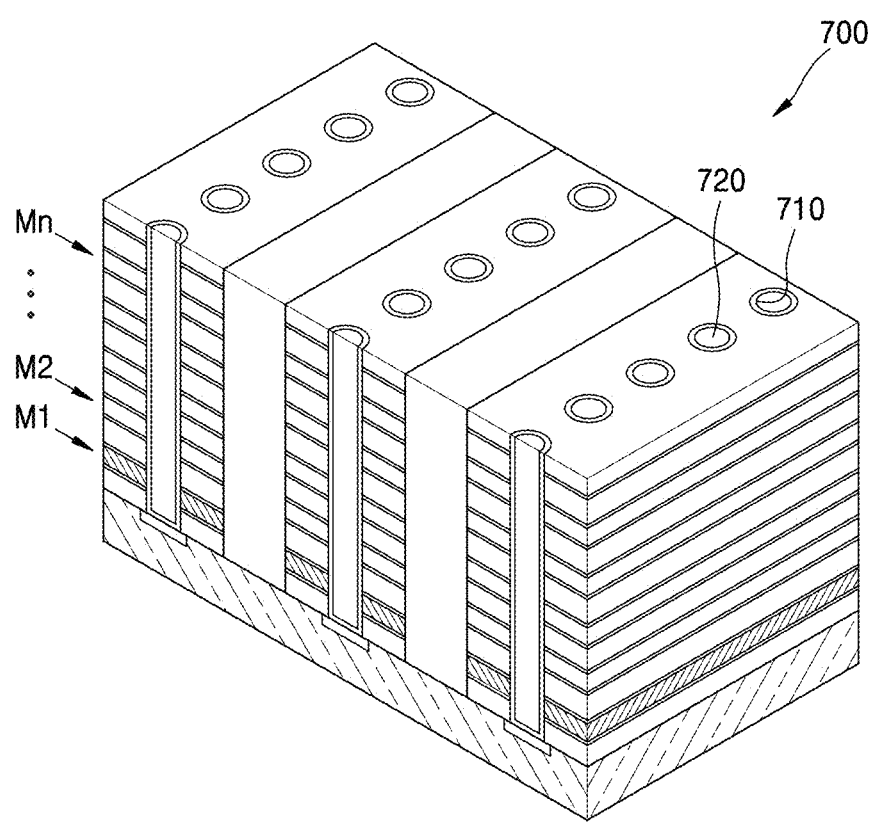
FIG. 27 illustrates an example of a three-dimensional (3D) NAND flash memory device according to an example embodiment.

FIG. 27 illustrates an example 700 of a three-dimensional (3D) NAND flash memory device according to an example embodiment.

Referring to FIG. 27, a plurality of memory cells M1, M2, . . . , and Mn may be stacked in a vertical direction. Also, gaps 710 having a high aspect ratio may be formed to penetrate the plurality of memory cells M1, M2, . . . , and Mn, and filling layers 720 including an insulating material may be filled in the gaps 710. By filling the insulating material in the gaps 710 having the high aspect ratio by using the gap filling technique described above, the filling layer 720 having no defects, such as a void, etc., may be formed.

The devices 500, 600, and 700 described above are only examples. In addition to the devices 500, 600, and 700, the gap filling technique according to the embodiments may be applied to manufacture various devices requiring a high aspect ratio and a high precision.

The devices 500, 600, and 700 described above may be applied to an electronic device.

Figure 28:
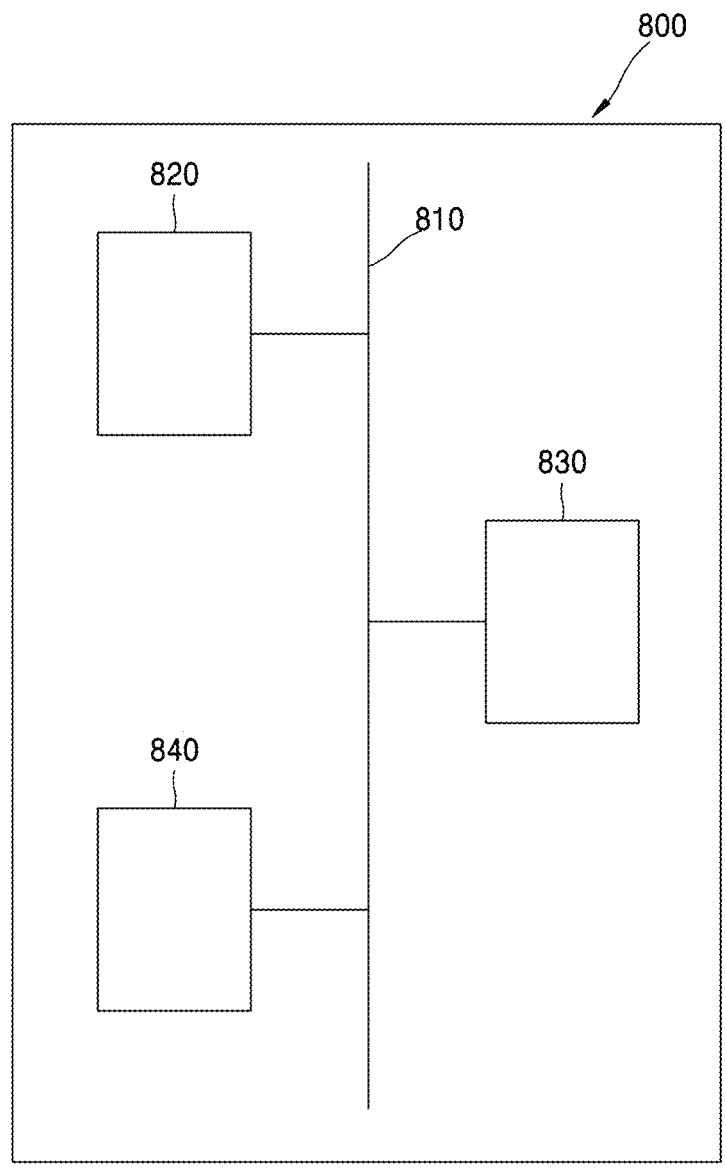
FIG. 28 is a block diagram of an electronic device according to an embodiment.

FIG. 28 is a block diagram of an electronic device according to an embodiment.

Referring to FIG. 28, an electronic device 800 may include a processor 820, a memory 830, and a display device 840 that are electrically coupled together via a bus 810. The display device 840 may be include a near-eye display device, such as the augmented reality glasses 550 described above in FIG. 25, but example embodiments are not limited thereto. In other embodiments, the display device 840 may include a LED display or other display and may include one or more filling layers provided in corresponding gaps, where the filling layers are provided using one of the aforementioned embodiments. The memory 830, which may be a non-transitory computer readable medium, may store a program of instructions and/or other information. In some embodiments, the memory 830 may include the DRAM device 600 described in FIG. 26 and/or the 3D NAND flash device 700 described in FIG. 27, but example embodiments are not limited thereto. In some embodiments, the memory 830 may include other types of memory, such as a phase-change random access memory (PRAM), a magneto-resistive RAM (MRAM), a resistive RAM (ReRAM), or a ferro-electric RAM (FRAM), a static RAM (SRAM), and the like. The processor 820 may execute the stored program of instructions to perform one or more functions. For example, the processor 820 may be configured to process electrical signals generated by an image sensor (not shown). The processor 820 may be configured to generate an output (e.g., an image to be displayed on a display interface) based on such as processing.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of filling a gap formed on a substrate using atomic layer deposition (ALD), the method comprising:
   forming a first reaction inhibition layer by adsorbing a reaction inhibitor onto a side wall of the gap, the reaction inhibitor including a precursor material that does not react with a second reactant, and the first reaction inhibition layer having a density gradient in which a density of the reaction inhibitor decreases toward a bottom of the gap;
   forming a first precursor layer by adsorbing a first reactant onto the bottom of the gap and the side wall of the gap around the bottom of the gap; and
   forming a first atomic layer on the bottom of the gap and the side wall of the gap around the bottom of the gap, the forming the first atomic layer including adsorbing the second reactant onto the first precursor layer, wherein the reaction inhibitor includes a center metal and a cyclopentadienyl (Cp) ligand, the center metal and a pentamethyl cyclopentadienyl (Cp*) ligand, Hf($^t$-BuO)$_4$, Hf(O$^i$Pr)$_4$, or Hf(O$^t$Bu)(NEtMe)$_3$.

2. The method of claim 1, wherein
   the density gradient of the first reaction inhibition layer is determined according to a following equation:

$$l = \frac{4w}{3}\left(\sqrt{1 + \frac{3}{8}\left(\frac{Pt}{S\sqrt{2\pi mkT}}\right)} - 1\right)$$

where $l$ indicates a depth (nm) of a location of the side wall of the gap, onto which the reaction inhibitor is adsorbed,
w indicates a width (nm) of the gap,
P indicates a partial pressure (Pa) of the reaction inhibitor in a reaction chamber,
t indicates an exposure time (s) of the reaction inhibitor,
m indicates a molecular mass (kg) of the reaction inhibitor,
S indicates a saturation dose of about $2.5 \times 10^{18}$ molecules*meter,
k indicates a Boltzmann factor $1.38 \times 10^{23}$ J/K, and
T indicates a temperature (K) in the reaction chamber.

3. The method of claim 1, wherein the reaction inhibitor is oxidized by O$_3$ or an O$_2$ plasma.

4. The method of claim 1, further comprising:
   converting the reaction inhibitor into a material of the first atomic layer via O$_3$ or O$_2$ plasma processing.

5. The method of claim 1, wherein the reaction inhibitor does not react with H$_2$O or O$_2$.

6. The method of claim 1, wherein the reaction inhibitor includes the center metal and the Cp ligand.

7. The method of claim 1, wherein the reaction inhibitor includes the center metal and the Cp* ligand.

8. The method of claim 1, wherein the reaction inhibitor includes TiCp*(OMe)$_3$, Ti(CpMe)(O$^i$Pr)$_3$, Ti(CpMe)(NMe$_2$)$_3$, ZrCp(NMe$_2$)$_3$ ZrCp$_2$Cl$_2$, Zr(Cp$_2$CMe$_2$)Me$_2$, Zr(Cp$_2$CMe$_2$)Me(OMe), HfCp(NMe$_2$)$_3$, or Hf(CpMe)(NMe$_2$)$_3$.

9. The method of claim 1, wherein the reaction inhibitor has a same center metal as a metal of the first reactant.

10. The method of claim 1, wherein the first reactant includes TiCl$_4$, Ti(O$^i$Pr)$_4$, Ti(NMe$_2$)$_4$, Ti(NMeEt)$_4$, Ti(NEt$_2$)$_4$, ZrCl$_4$, Zr(NMe$_2$)$_4$, Zr(O$^t$Bu)$_4$, ZrCp$_2$Me$_2$, Zr(MeCp)$_2$(OMe)Me, HfCl$_4$, Hf(NMe$_2$)$_4$, Hf(NEtMe)$_4$, Hf(NEt$_2$)$_4$, HfCp2Me$_2$, or Hf(MeCp)$_2$(OMe)Me.

11. The method of claim 1, wherein the second reactant includes H$_2$O or O$_2$.

12. The method of claim 1, wherein an average density of the reaction inhibitor increases as a partial pressure of the reaction inhibitor in a reaction chamber increases.

13. The method of claim 1, wherein the adsorbing the reaction inhibitor is repeatedly performed for a plurality of cycles, and an average density of the reaction inhibitor increases as a number of cycles increases.

14. The method of claim 1, further comprising:
forming a first filling layer by repeatedly performing the forming the first precursor layer and the forming the first atomic layer for a plurality of cycles, wherein
the first filling layer and the first reactant include a same metal.

15. The method of claim 14, wherein the density of the reaction inhibitor decreases toward the bottom of the gap so that the first filling layer is formed in a bottom-up direction from the bottom of the gap.

16. The method of claim 15, wherein the first filling layer is formed to have a shape varying according to an average density of the reaction inhibitor.

17. The method of claim 16, wherein the first filling layer has the shape in which the first filling layer is formed a bottom-up direction from the bottom of the gap.

18. The method of claim 16, wherein the first filling layer has the shape in which the first filling layer is formed from the bottom of the gap and the side wall of the gap around the bottom of the gap.

19. The method of claim 16, wherein a gap filling process time is adjusted according to the shape in which the first filling layer is formed.

20. The method of claim 14, further comprising:
forming a second reaction inhibition layer on the side wall of the gap after the forming the first filling layer;
forming a second precursor layer on an upper surface of the first filling layer and the side wall of the gap around the upper surface of the first filling layer; and
forming a second atomic layer on the upper surface of the first filling layer and the side wall of the gap around the upper surface of the first filling layer.

21. The method of claim 20, further comprising:
forming a second filling layer in a bottom-up direction from the upper surface of the first filling layer, by repeatedly performing the forming the second precursor layer and the forming the second atomic layer for a plurality of cycles.

22. A method of filling a gap formed on a structure using atomic layer deposition (ALD), the structure defining the gap and including a first reaction inhibition layer including a reaction inhibitor adsorbed onto a side wall of the gap, the method comprising:
forming a first precursor layer by adsorbing a first reactant onto a first exposed region of the gap,
the first exposed region of the gap including a bottom of the gap and first portions of the side wall of the gap around the bottom of the gap,
the first reaction inhibition layer defining the first exposed region of the gap based on the first reaction inhibition layer having a density gradient in which a density of the reaction inhibitor decreases toward the bottom of the gap such that the first reaction inhibition layer exposes the first portions of the side wall of the gap and the bottom of the gap,
the reaction inhibitor including a precursor material; and
forming a first atomic layer on the first exposed region of the gap by adsorbing a second reactant onto the first precursor layer,
the second reactant being a material that does not react with the precursor material in the reaction inhibitor, wherein
the reaction inhibitor includes a center metal and a cyclopentadienyl (Cp) ligand, the center metal and a pentamethyl cyclopentadienyl (Cp*) ligand, Hf($^t$BuO)$_4$, Hf(O$^i$Pr)$_4$, or Hf(O$^t$Bu) (NEtMe)$_3$.

23. The method of claim 22, wherein the reaction inhibitor is oxidized by O$_3$ or an O$_2$ plasma.

24. The method of claim 22, further comprising:
removing the reaction inhibitor by converting the reaction inhibitor into a material of the first atomic layer via O$_3$ or O$_2$ plasma processing.

25. The method of claim 22, wherein
the reaction inhibitor includes a center metal and an organic ligand.

26. The method of claim 22, wherein the second reactant includes H$_2$O or O$_2$.

27. The method of claim 1, wherein the reaction inhibitor includes Hf($^t$BuO)$_4$, Hf(O$^i$Pr)$_4$, or Hf(O$^t$Bu)(NEtMe)$_3$.

28. The method of claim 22, wherein the reaction inhibitor includes Hf($^t$BuO)$_4$, Hf(O$^i$Pr)$_4$, or Hf(O$^t$Bu)(NEtMe)$_3$.

29. A method of filling a gap formed on a substrate using atomic layer deposition (ALD), the method comprising:
forming a first reaction inhibition layer by adsorbing a reaction inhibitor onto a side wall of the gap, the reaction inhibitor including a precursor material that does not react with a second reactant, and the first reaction inhibition layer having a density gradient in which a density of the reaction inhibitor decreases toward a bottom of the gap;
forming a first precursor layer by adsorbing a first reactant onto the bottom of the gap and the side wall of the gap around the bottom of the gap; and
forming a first atomic layer on the bottom of the gap and the side wall of the gap around the bottom of the gap, the forming the first atomic layer including adsorbing the second reactant onto the first precursor layer, wherein
the reaction inhibitor includes a center metal and a cyclopentadienyl (Cp) ligand, the center metal and a pentamethyl cyclopentadienyl (Cp*) ligand, Hf($^t$BuO)$_4$, Hf(O$^i$Pr)$_4$, or Hf(O$^t$Bu)(NEtMe)$_3$,
the first reactant includes TiCl$_4$, Ti (OiPr)$_4$, Ti(NMe$_2$)$_4$, Ti(NMeEt)$_4$, Ti(NEt$_2$)$_4$, ZrCl$_4$, Zr(NMe$_2$)$_4$, Zr(O$^t$Bu)$_4$, ZrCp$_2$Me$_2$, Zr(MeCp)$_2$(OMe)Me, HfCl$_4$, Hf(NMe$_2$)$_4$, Hf(NEtMe)$_4$, Hf(NEt$_2$)$_4$, HfCp2Me$_2$, or Hf(MeCp)$_2$(OMe)Me, and
the second reactant includes H$_2$O or O$_2$.

30. A method of filling a gap formed on a substrate using atomic layer deposition (ALD), the method comprising:
- forming a first reaction inhibition layer by adsorbing a reaction inhibitor onto a side wall of the gap, the reaction inhibitor including a precursor material that does not react with a second reactant, and the first reaction inhibition layer having a density gradient in which a density of the reaction inhibitor decreases toward a bottom of the gap;
- forming a first precursor layer by adsorbing a first reactant onto the bottom of the gap and the side wall of the gap around the bottom of the gap;
- forming a first atomic layer on the bottom of the gap and the side wall of the gap around the bottom of the gap, the forming the first atomic layer including adsorbing the second reactant onto the first precursor layer;
- forming a first filling layer by repeatedly performing the forming the first precursor layer and the forming the first atomic layer for a plurality of cycles;
- forming a second reaction inhibition layer on the side wall of the gap after the forming the first filling layer;
- forming a second precursor layer on an upper surface of the first filling layer and the side wall of the gap around the upper surface of the first filling layer; and
- forming a second atomic layer on the upper surface of the first filling layer and the side wall of the gap around the upper surface of the first filling layer.

31. The method of claim 30, further comprising:
- forming a second filling layer in a bottom-up direction from the upper surface of the first filling layer, by repeatedly performing the forming the second precursor layer and the forming the second atomic layer for a plurality of cycles.

32. The method of claim 22, wherein the reaction inhibitor includes the center metal and the Cp ligand.

33. The method of claim 22, wherein the reaction inhibitor includes the center metal and the Cp* ligand.

34. The method of claim 22, wherein the reaction inhibitor includes $TiCp*(OMe)_3$, $Ti(CpMe)(O^iPr)_3$, $Ti(CpMe)(NMe_2)_3$, $ZrCp(NMe_2)_3$, $ZrCp_2Cl_2$, $Zr(Cp_2CMe_2)Me_2$, $Zr(Cp_2CMe_2)Me(OMe)$, $HfCp(NMe_2)_3$, or $Hf(CpMe)(NMe_2)_3$.

* * * * *